(12) United States Patent
Kato

(10) Patent No.: US 8,342,416 B2
(45) Date of Patent: Jan. 1, 2013

(54) WIRELESS IC DEVICE, WIRELESS IC MODULE AND METHOD OF MANUFACTURING WIRELESS IC MODULE

(75) Inventor: Noboru Kato, Takatsuki (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/169,067

(22) Filed: Jun. 27, 2011

(65) Prior Publication Data

US 2011/0253795 A1    Oct. 20, 2011

Related U.S. Application Data

(63) Continuation of application No. PCT/JP2010/050170, filed on Jan. 8, 2010.

(30) Foreign Application Priority Data

| Jan. 9, 2009 | (JP) | 2009-003315 |
| Jan. 30, 2009 | (JP) | 2009-019695 |
| Sep. 11, 2009 | (JP) | 2009-210723 |

(51) Int. Cl.
G06K 19/06    (2006.01)
(52) U.S. Cl. .................. 235/492; 235/451
(58) Field of Classification Search .............. 235/375, 235/451, 492; 340/572.1, 572.7
See application file for complete search history.

(56) References Cited

U.S. PATENT DOCUMENTS

| 3,364,564 A | 1/1968 | Kurtz et al. |
| 4,794,397 A | 12/1988 | Ohe et al. |
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,528,222 A | 6/1996 | Moskowitz et al. |
| 5,757,074 A | 5/1998 | Matloubian et al. |
| 5,854,480 A | 12/1998 | Noto |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |
| 6,104,611 A | 8/2000 | Glover et al. |
| 6,107,920 A | 8/2000 | Eberhardt et al. |

(Continued)

FOREIGN PATENT DOCUMENTS

DE    10 2006 057 369 A1    6/2008

(Continued)

OTHER PUBLICATIONS

Official communication issued in Japanese Application No. 2007-531524, mailed on Sep. 11, 2007.

(Continued)

*Primary Examiner* — Tuyen K Vo
(74) *Attorney, Agent, or Firm* — Keating & Bennett, LLP

(57) ABSTRACT

A wireless IC module that can function as a component of an RFID system even when mounted on a metal article includes a loop-shaped electrode that is constructed such that a plane of a loop of the loop-shaped electrode is substantially perpendicular to the mounting surface of a wireless IC module. The loop-shaped electrode functions as a magnetic field antenna and is electromagnetically coupled with a metal article so that the surface of the metal article functions as a radiator antenna.

11 Claims, 15 Drawing Sheets

U.S. PATENT DOCUMENTS

| | | |
|---|---|---|
| 6,172,608 B1 | 1/2001 | Cole |
| 6,181,287 B1 | 1/2001 | Beigel |
| 6,190,942 B1 | 2/2001 | Wilm et al. |
| 6,249,258 B1 | 6/2001 | Bloch et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,812,707 B2 | 11/2004 | Yonezawa et al. |
| 6,828,881 B2 | 12/2004 | Mizutani et al. |
| 6,837,438 B1 | 1/2005 | Takasugi et al. |
| 6,861,731 B2 | 3/2005 | Buijsman et al. |
| 6,927,738 B2 | 8/2005 | Senba et al. |
| 6,963,729 B2 | 11/2005 | Uozumi |
| 7,088,249 B2 | 8/2006 | Senba et al. |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 2002/0011967 A1 | 1/2002 | Goff et al. |
| 2002/0015002 A1 | 2/2002 | Yasukawa et al. |
| 2002/0044092 A1 | 4/2002 | Kushihi |
| 2002/0067316 A1 | 6/2002 | Yokoshima et al. |
| 2002/0093457 A1 | 7/2002 | Hamada et al. |
| 2003/0006901 A1 | 1/2003 | Kim et al. |
| 2003/0020661 A1 | 1/2003 | Sato |
| 2003/0045324 A1 | 3/2003 | Nagumo et al. |
| 2003/0169153 A1 | 9/2003 | Muller |
| 2004/0001027 A1 | 1/2004 | Killen et al. |
| 2004/0026519 A1 | 2/2004 | Usami et al. |
| 2004/0056823 A1 | 3/2004 | Zuk et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2004/0252064 A1 | 12/2004 | Yuanzhu |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0134460 A1 | 6/2005 | Usami |
| 2005/0134506 A1 | 6/2005 | Egbert |
| 2005/0138798 A1 | 6/2005 | Sakama et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0275539 A1 | 12/2005 | Sakama et al. |
| 2006/0001138 A1 | 1/2006 | Sakama et al. |
| 2006/0032926 A1 | 2/2006 | Baba et al. |
| 2006/0044192 A1 | 3/2006 | Egbert |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0145872 A1 | 7/2006 | Tanaka et al. |
| 2006/0158380 A1 | 7/2006 | Son et al. |
| 2006/0170606 A1 | 8/2006 | Yamagajo et al. |
| 2006/0214801 A1 | 9/2006 | Murofushi et al. |
| 2006/0220871 A1 | 10/2006 | Baba et al. |
| 2006/0244676 A1 | 11/2006 | Uesaka |
| 2006/0267138 A1 | 11/2006 | Kobayashi |
| 2007/0004028 A1 | 1/2007 | Lair et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0057854 A1 | 3/2007 | Oodachi et al. |
| 2007/0069037 A1 | 3/2007 | Kawai |
| 2007/0132591 A1 | 6/2007 | Khatri |
| 2007/0164414 A1 | 7/2007 | Dokai et al. |
| 2007/0200782 A1 | 8/2007 | Hayama et al. |
| 2007/0229276 A1 | 10/2007 | Yamagajo et al. |
| 2007/0252700 A1 | 11/2007 | Ishihara et al. |
| 2007/0252703 A1 | 11/2007 | Kato et al. |
| 2007/0285335 A1 | 12/2007 | Bungo et al. |
| 2007/0290928 A1 | 12/2007 | Chang et al. |
| 2008/0024156 A1 | 1/2008 | Arai et al. |
| 2008/0087990 A1 | 4/2008 | Kato et al. |
| 2008/0169905 A1 | 7/2008 | Slatter |
| 2008/0272885 A1 | 11/2008 | Atherton |
| 2009/0002130 A1 | 1/2009 | Kato |
| 2009/0009007 A1 | 1/2009 | Kato et al. |
| 2009/0021446 A1 | 1/2009 | Kataya et al. |
| 2009/0065594 A1 | 3/2009 | Kato et al. |
| 2009/0109102 A1 | 4/2009 | Dokai et al. |
| 2009/0160719 A1 | 6/2009 | Kato et al. |
| 2009/0201116 A1 | 8/2009 | Orihara |
| 2009/0224061 A1 | 9/2009 | Kato et al. |
| 2009/0231106 A1 | 9/2009 | Okamura |
| 2009/0262041 A1 | 10/2009 | Ikemoto et al. |
| 2009/0278687 A1 | 11/2009 | Kato |

FOREIGN PATENT DOCUMENTS

| | | |
|---|---|---|
| EP | 0 694 874 A2 | 1/1996 |
| EP | 0 977 145 A2 | 2/2000 |
| EP | 1 010 543 A1 | 6/2000 |
| EP | 1 160 915 A2 | 12/2001 |
| EP | 1 170 795 A2 | 1/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 548 872 A1 | 6/2005 |
| EP | 1 703 589 A1 | 9/2006 |
| EP | 1 744 398 A1 | 1/2007 |
| EP | 1 841 005 A1 | 10/2007 |
| EP | 1 865 574 A1 | 12/2007 |
| EP | 1 976 056 A1 | 10/2008 |
| EP | 1 993 170 A1 | 11/2008 |
| EP | 2 009 738 A1 | 12/2008 |
| EP | 2 012 258 A1 | 1/2009 |
| EP | 2 148 449 A1 | 1/2010 |
| EP | 2 251 934 A1 | 11/2010 |
| GB | 2 305 075 A | 3/1997 |
| JP | 50-143451 A | 11/1975 |
| JP | 62-127140 U | 8/1987 |
| JP | 02-164105 A | 6/1990 |
| JP | 03-262313 A | 11/1991 |
| JP | 04-150011 A | 5/1992 |
| JP | 04-167500 A | 6/1992 |
| JP | 05-327331 A | 12/1993 |
| JP | 6-53733 A | 2/1994 |
| JP | 06-077729 A | 3/1994 |
| JP | 06-177635 A | 6/1994 |
| JP | 6-260949 A | 9/1994 |
| JP | 07-183836 A | 7/1995 |
| JP | 08-056113 A | 2/1996 |
| JP | 8-87580 A | 4/1996 |
| JP | 08-088586 A | 4/1996 |
| JP | 08-88586 A | 4/1996 |
| JP | 11-149537 A | 6/1996 |
| JP | 08-176421 A | 7/1996 |
| JP | 08-180160 A | 7/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-035025 A | 2/1997 |
| JP | 9-93029 A | 4/1997 |
| JP | 09-245381 A | 9/1997 |
| JP | 09-252217 A | 9/1997 |
| JP | 09-270623 A | 10/1997 |
| JP | 9-512367 A | 12/1997 |
| JP | 10-69533 A | 3/1998 |

| | | | | | | |
|---|---|---|---|---|---|---|
| JP | 10-069533 | A | 3/1998 | JP | 2002-185358 A | 6/2002 |
| JP | 10-505466 | A | 5/1998 | JP | 2002-204117 A | 7/2002 |
| JP | 10-171954 | A | 6/1998 | JP | 2002-522849 A | 7/2002 |
| JP | 10-193849 | A | 7/1998 | JP | 2002-230128 A | 8/2002 |
| JP | 10-193851 | A | 7/1998 | JP | 2002-232221 A | 8/2002 |
| JP | 10-293828 | A | 11/1998 | JP | 2002-252117 A | 9/2002 |
| JP | 11-039441 | A | 2/1999 | JP | 2002-259934 A | 9/2002 |
| JP | 11-075329 | A | 3/1999 | JP | 2002-280821 A | 9/2002 |
| JP | 11-085937 | A | 3/1999 | JP | 2002-298109 A | 10/2002 |
| JP | 11-88241 | A | 3/1999 | JP | 2002-308437 A | 10/2002 |
| JP | 11-102424 | A | 4/1999 | JP | 2002-319008 A | 10/2002 |
| JP | 11-103209 | A | 4/1999 | JP | 2002-319009 A | 10/2002 |
| JP | 11-149536 | A | 6/1999 | JP | 2002-319812 A | 10/2002 |
| JP | 11-149538 | A | 6/1999 | JP | 2002-362613 A | 12/2002 |
| JP | 11-219420 | A | 8/1999 | JP | 2002-366917 A | 12/2002 |
| JP | 11-220319 | A | 8/1999 | JP | 2002-373029 A | 12/2002 |
| JP | 11-328352 | A | 11/1999 | JP | 2002-373323 A | 12/2002 |
| JP | 11-346114 | A | 12/1999 | JP | 2002-374139 A | 12/2002 |
| JP | 11-515094 | A | 12/1999 | JP | 2003-006599 A | 1/2003 |
| JP | 2000-21128 | A | 1/2000 | JP | 2003-016412 A | 1/2003 |
| JP | 2000-021639 | A | 1/2000 | JP | 2003-022912 A | 1/2003 |
| JP | 2000-022421 | A | 1/2000 | JP | 2003-026177 A | 1/2003 |
| JP | 2005-229474 | A | 1/2000 | JP | 2003-030612 A | 1/2003 |
| JP | 2000-059260 | A | 2/2000 | JP | 2003-44789 A | 2/2003 |
| JP | 2000-085283 | A | 3/2000 | JP | 2003-046318 A | 2/2003 |
| JP | 2000-090207 | A | 3/2000 | JP | 2003-58840 A | 2/2003 |
| JP | 2000-132643 | A | 5/2000 | JP | 2003-067711 A | 3/2003 |
| JP | 2000-137778 | A | 5/2000 | JP | 2003-069335 A | 3/2003 |
| JP | 2000-137779 | A | 5/2000 | JP | 2003-076947 A | 3/2003 |
| JP | 2000-137785 | A | 5/2000 | JP | 2003-76963 A | 3/2003 |
| JP | 2000-148948 | A | 5/2000 | JP | 2003-78333 A | 3/2003 |
| JP | 2000-172812 | A | 6/2000 | JP | 2003-078336 A | 3/2003 |
| JP | 2000-209013 | A | 7/2000 | JP | 2003-085501 A | 3/2003 |
| JP | 2000-222540 | A | 8/2000 | JP | 2003-085520 A | 3/2003 |
| JP | 2000-510271 | A | 8/2000 | JP | 2003-87008 A | 3/2003 |
| JP | 2000-242754 | A | 9/2000 | JP | 2003-87044 A | 3/2003 |
| JP | 2000-243797 | A | 9/2000 | JP | 2003-099720 A | 4/2003 |
| JP | 2000-251049 | A | 9/2000 | JP | 2003-099721 A | 4/2003 |
| JP | 2000-261230 | A | 9/2000 | JP | 2003-110344 A | 4/2003 |
| JP | 2000-276569 | A | 10/2000 | JP | 2003-132330 A | 5/2003 |
| JP | 2000-286634 | A | 10/2000 | JP | 2003-134007 A | 5/2003 |
| JP | 2000-286760 | A | 10/2000 | JP | 2003-155062 A | 5/2003 |
| JP | 2000-311226 | A | 11/2000 | JP | 2003-158414 A | 5/2003 |
| JP | 2000-321984 | A | 11/2000 | JP | 2003-168760 A | 6/2003 |
| JP | 3075400 | U | 11/2000 | JP | 2003-179565 A | 6/2003 |
| JP | 2000-349680 | A | 12/2000 | JP | 2003-187207 A | 7/2003 |
| JP | 2001-10264 | A | 1/2001 | JP | 2003-187211 A | 7/2003 |
| JP | 2001-028036 | A | 1/2001 | JP | 2003-188338 A | 7/2003 |
| JP | 2007-18067 | A | 1/2001 | JP | 2003-188620 A | 7/2003 |
| JP | 2001-043340 | A | 2/2001 | JP | 2003-198230 A | 7/2003 |
| JP | 2001-66990 | A | 3/2001 | JP | 2003-209421 A | 7/2003 |
| JP | 2001-76111 | A | 3/2001 | JP | 2003-216919 A | 7/2003 |
| JP | 2001-505682 | A | 4/2001 | JP | 2003-218624 A | 7/2003 |
| JP | 2001-168628 | A | 6/2001 | JP | 2003-233780 A | 8/2003 |
| JP | 2001-188890 | A | 7/2001 | JP | 2003-242471 A | 8/2003 |
| JP | 2001-240046 | A | 9/2001 | JP | 2003-243918 A | 8/2003 |
| JP | 2001-256457 | A | 9/2001 | JP | 2003-249813 A | 9/2003 |
| JP | 2001-257292 | A | 9/2001 | JP | 2003-529163 A | 9/2003 |
| JP | 2001-514777 | A | 9/2001 | JP | 2003-288560 A | 10/2003 |
| JP | 2001-319380 | A | 11/2001 | JP | 2003-309418 A | 10/2003 |
| JP | 2001-331976 | A | 11/2001 | JP | 2003-317060 A | 11/2003 |
| JP | 2001-332923 | A | 11/2001 | JP | 2003-331246 A | 11/2003 |
| JP | 2001-339226 | A | 12/2001 | JP | 2003-332820 A | 11/2003 |
| JP | 2001-344574 | A | 12/2001 | JP | 2003-536302 A | 12/2003 |
| JP | 2001-351084 | A | 12/2001 | JP | 2004-040597 A | 2/2004 |
| JP | 2001-352176 | A | 12/2001 | JP | 2004-505481 A | 2/2004 |
| JP | 2002-024776 | A | 1/2002 | JP | 2004-082775 A | 3/2004 |
| JP | 2002-026513 | A | 1/2002 | JP | 2004-88218 A | 3/2004 |
| JP | 2002-32731 | A | 1/2002 | JP | 2004-93693 A | 3/2004 |
| JP | 2002-042076 | A | 2/2002 | JP | 2004-096566 A | 3/2004 |
| JP | 2002-063557 | A | 2/2002 | JP | 2004-127230 A | 4/2004 |
| JP | 2002-505645 | A | 2/2002 | JP | 2004-140513 A | 5/2004 |
| JP | 2002-76750 | A | 3/2002 | JP | 2004-213582 A | 7/2004 |
| JP | 2002-076750 | A | 3/2002 | JP | 2004-519916 A | 7/2004 |
| JP | 2002-150245 | A | 5/2002 | JP | 2004-234595 A | 8/2004 |
| JP | 2002-157564 | A | 5/2002 | JP | 2004-253858 A | 9/2004 |
| JP | 2002-158529 | A | 5/2002 | JP | 2004-527864 A | 9/2004 |
| JP | 2002-175508 | A | 6/2002 | JP | 2004-280390 A | 10/2004 |
| JP | 2002-183690 | A | 6/2002 | JP | 2004-287767 A | 10/2004 |

| | | | |
|---|---|---|---|
| JP | 2004-297249 A | 10/2004 |
| JP | 2004-297681 A | 10/2004 |
| JP | 2004-304370 A | 10/2004 |
| JP | 2004-319848 A | 11/2004 |
| JP | 2004-326380 A | 11/2004 |
| JP | 2004-334268 A | 11/2004 |
| JP | 2004-336250 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-5866 A | 1/2005 |
| JP | 2005-18156 A | 1/2005 |
| JP | 2005-124061 A | 5/2005 |
| JP | 2005-128592 A | 5/2005 |
| JP | 2005-129019 A | 5/2005 |
| JP | 2005-135132 A | 5/2005 |
| JP | 2005-136528 A | 5/2005 |
| JP | 2005-137032 A | 5/2005 |
| JP | 3653099 B2 | 5/2005 |
| JP | 2005-165839 A | 6/2005 |
| JP | 2005-167327 A | 6/2005 |
| JP | 2005-167813 A | 6/2005 |
| JP | 2005-190417 A | 7/2005 |
| JP | 2005-191705 A | 7/2005 |
| JP | 2005-210676 A | 8/2005 |
| JP | 2005-210680 A | 8/2005 |
| JP | 2005-217822 A | 8/2005 |
| JP | 2005-236339 A | 9/2005 |
| JP | 2005-244778 A | 9/2005 |
| JP | 2005-252853 A | 9/2005 |
| JP | 2005-275870 A | 10/2005 |
| JP | 2005-284352 A | 10/2005 |
| JP | 2005-293537 A | 10/2005 |
| JP | 2005-295135 A | 10/2005 |
| JP | 2005-311205 A | 11/2005 |
| JP | 2005-321305 A | 11/2005 |
| JP | 2005-322119 A | 11/2005 |
| JP | 2005-335755 A | 12/2005 |
| JP | 2005-340759 A | 12/2005 |
| JP | 2005-345802 A | 12/2005 |
| JP | 2005-346820 A | 12/2005 |
| JP | 2005-352858 A | 12/2005 |
| JP | 2006-013976 A | 1/2006 |
| JP | 2006-13976 A | 1/2006 |
| JP | 2006-025390 A | 1/2006 |
| JP | 2006-031766 A | 2/2006 |
| JP | 2006-39902 A | 2/2006 |
| JP | 2006-42059 A | 2/2006 |
| JP | 2006-42097 A | 2/2006 |
| JP | 2006-053833 A | 2/2006 |
| JP | 2006-67479 A | 3/2006 |
| JP | 2006-72706 A | 3/2006 |
| JP | 2006-80367 A | 3/2006 |
| JP | 2006-92630 A | 4/2006 |
| JP | 2006-102953 A | 4/2006 |
| JP | 2006-107296 A | 4/2006 |
| JP | 2006-513594 A | 4/2006 |
| JP | 2006-148462 A | 6/2006 |
| JP | 2006-148518 A | 6/2006 |
| JP | 2006-151402 A | 6/2006 |
| JP | 2006-174151 A | 6/2006 |
| JP | 2006-195795 A | 7/2006 |
| JP | 2006-203187 A | 8/2006 |
| JP | 2006-203852 A | 8/2006 |
| JP | 2006-217000 A | 8/2006 |
| JP | 2006-232292 A | 9/2006 |
| JP | 2006-237674 A | 9/2006 |
| JP | 2006-270212 A | 10/2006 |
| JP | 2006-270766 A | 10/2006 |
| JP | 2006-285911 A | 10/2006 |
| JP | 2006-295879 A | 10/2006 |
| JP | 2006-302219 A | 11/2006 |
| JP | 2006-309401 A | 11/2006 |
| JP | 2006-311239 A | 11/2006 |
| JP | 2006-323481 A | 11/2006 |
| JP | 2006-339964 A | 12/2006 |
| JP | 2007-007888 A | 1/2007 |
| JP | 2007-13120 A | 1/2007 |
| JP | 2007-28002 A | 2/2007 |
| JP | 2007-043535 A | 2/2007 |
| JP | 2007-048126 A | 2/2007 |
| JP | 2007-65822 A | 3/2007 |
| JP | 2007-79687 A | 3/2007 |
| JP | 2007-81712 A | 3/2007 |
| JP | 2007-096768 A | 4/2007 |
| JP | 2007-102348 A | 4/2007 |
| JP | 2007-122542 A | 5/2007 |
| JP | 2007-150642 A | 6/2007 |
| JP | 2007-150868 A | 6/2007 |
| JP | 2007-159083 A | 6/2007 |
| JP | 2007-159129 A | 6/2007 |
| JP | 2007-166133 A | 6/2007 |
| JP | 2007-172369 A | 7/2007 |
| JP | 2007-172527 A | 7/2007 |
| JP | 2007-228325 A | 9/2007 |
| JP | 2007-266999 A | 10/2007 |
| JP | 2007-272264 A | 10/2007 |
| JP | 2007-287128 A | 11/2007 |
| JP | 2007-312350 A | 11/2007 |
| JP | 2007-324865 A | 12/2007 |
| JP | 2008-033716 A | 2/2008 |
| JP | 2008-72243 A | 3/2008 |
| JP | 2008-097426 A | 4/2008 |
| JP | 4069958 B2 | 4/2008 |
| JP | 2008-107947 A | 5/2008 |
| JP | 2008-148345 A | 6/2008 |
| JP | 2008-519347 A | 6/2008 |
| JP | 2008-160874 A | 7/2008 |
| JP | 11-175678 A | 1/2009 |
| JP | 2009-25870 A | 2/2009 |
| JP | 2009-27291 A | 2/2009 |
| JP | 2009-044715 A | 2/2009 |
| NL | 9100176 A | 3/1992 |
| NL | 9100347 A | 3/1992 |
| WO | 99/67754 A1 | 12/1999 |
| WO | 00/10122 A2 | 2/2000 |
| WO | 01/95242 A2 | 12/2001 |
| WO | 02/48980 A1 | 6/2002 |
| WO | 02/061675 A1 | 8/2002 |
| WO | 02/097723 A1 | 12/2002 |
| WO | 03/079305 A1 | 9/2003 |
| WO | 2004/036772 A1 | 4/2004 |
| WO | 2004/070879 A | 8/2004 |
| WO | 2004/072892 A1 | 8/2004 |
| WO | 2005/073937 A | 8/2005 |
| WO | 2005/091434 A1 | 9/2005 |
| WO | 2005/115849 A1 | 12/2005 |
| WO | 2006/045682 A | 5/2006 |
| WO | 2006/048663 A1 | 5/2006 |
| WO | 2006/114821 A1 | 11/2006 |
| WO | 2007/083574 A1 | 7/2007 |
| WO | 2007/083575 A1 | 7/2007 |
| WO | 2007/086130 A1 | 8/2007 |
| WO | 2007/102360 A1 | 9/2007 |
| WO | 2007/119310 A1 | 10/2007 |
| WO | 2007/125683 A1 | 11/2007 |
| WO | 2007/138857 A1 | 12/2007 |
| WO | 2008/007606 A | 1/2008 |
| WO | 2008/126458 A1 | 10/2008 |
| WO | 2008/140037 A1 | 11/2008 |
| WO | 2008/142957 A1 | 11/2008 |
| WO | 2009/011376 A1 | 1/2009 |
| WO | 2009/081719 A1 | 7/2009 |
| WO | 2009/110381 A1 | 9/2009 |

OTHER PUBLICATIONS

Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags"), RFID, pp. 112-126.
Dokai et al.: "Wireless IC Device and Component for Wireless IC Device"; U.S. Appl. No. 11/624,382, filed Jan. 18, 2007.

Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official Communication issued in International Patent Application No. PCT/JP2009/056934, mailed on Jun. 30, 2009.

Kato et al.: "Wireless IC Device"; U.S. Appl. No. 12/903,242, filed Oct. 13, 2010.
Kato et al.: "Wireless IC Device"; U.S. Appl. No. 12/940,103, filed Nov. 5, 2010.
Kato et al.: "Wireless IC Device System and Method of Determining Authenticity of Wireless IC Device"; U.S. Appl. No. 12/940,105, filed Nov. 5, 2010.
Official Communication issued in International Patent Application No. PCT/JP2009/059669, mailed on Aug. 25, 2009.
Official Communication issued in International Patent Application No. PCT/JP2009/062181, mailed on Oct. 13, 2009.
Official Communication issued in corresponding Japanese Application No. 2010-501323, mailed on Apr. 6, 2010.
Kato et al.: "Component of Wireless IC Device and Wireless IC Device"; U.S. Appl. No. 12/944,099, filed Nov. 11, 2010.
Kato et al.: Wireless IC Device and Manufacturing Method Thereof; U.S. Appl. No. 12/961,599, filed Dec. 7, 2010.
Kataya et al.: "Radio Frequency IC Device and Electronic Apparatus"; U.S. Appl. No. 12/959,454, filed Dec. 3, 2010.
Ikemoto et al.:"Radio IC Device"; U.S. Appl. No. 12/981,582, filed Dec. 30, 2010.
Official Communication issued in International Patent Application No. PCT/JP2009/062801, mailed on Oct. 27, 2009.
Ikemoto et al.: "Wireless IC Device and Electronic Apparatus"; U.S. Appl. No. 13/022,695, filed Feb. 8, 2011.
Official Communication issued in International Patent Application No. PCT/JP2009/067778, mailed on Jan. 26, 2010.
Kato: "Wireless IC Device and Method for Manufacturing Same"; U.S. Appl. No. 13/022,693, filed Feb. 8, 2011.
Kato: "Wireless IC Device"; U.S. Appl. No. 13/080,781, filed Apr. 6, 2011.
Official communication issued in counterpart International Application No. PCT/JP2008/071502, mailed Feb. 24, 2009.
Kato et al.: "Wireless IC Device and Manufacturing Method Thereof," U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device," U.S. Appl. No. 12/469,896, filed May 21, 2009.
Ikemoto et al.: "Wireless IC Device," U.S. Appl. No. 12/496,709, filed Jul. 2, 2009.
Official communication issued in counterpart International Application No. PCT/JP2008/062947, mailed Aug. 19, 2008.
Official communication issued in counterpart International Application No. PCT/JP2008/056026, mailed Jul. 1, 2008.
Ikemoto et al.: "Wireless IC Device and Electronic Apparatus,"; U.S. Appl. No. 12/503,188, filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device," U.S. Appl. No. 12/510,338, filed Jul. 28, 2009.
Kato et al.: "Wireless IC Device," U.S. Appl. No. 12/510,340, filed Jul. 28, 2009.
Kato: "Wireless IC Device," U.S. Appl. No. 12/510,344, filed Jul. 28, 2009.
Kato et al.: "Wireless IC Device," U.S. Appl. No. 12/510,347, filed Jul. 28, 2009.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official communication issued in International Application No. PCT/JP2008/050356, mailed on Mar. 25, 2008.

Osamura et al.: "Packaging Material with Electromagnetic Coupling Module," U.S. Appl. No. 12/536,663, filed Aug. 6, 2009.
Osamura et al.: "Packaging Material With Electromagnetic Coupling Module," U.S. Appl. No. 12/536,669, filed Aug. 6, 2009.
Dokai et al.: "Wireless IC Device and Component for Wireless IC Device," U.S. Appl. No. 12/543,553, filed Aug. 19, 2009.
Shioya et al.: "Wireless IC Device," U.S. Appl. No. 12/551,037, filed Aug. 31, 2009.
Ikemoto: "Wireless IC Device and Manufacturing Method Thereof," U.S. Appl. No. 12/579,672, filed Oct. 15, 2009.
Official communication issued in International Application No. PCT/JP2008/058614, mailed on Jun. 10, 2008.
Official Communication issued in International Patent Application No. PCT/JP2009/069486, mailed on Mar. 2, 2010.
Kato: "Radio IC Device"; U.S. Appl. No. 13/080,775, filed Apr. 6, 2011.
Kato et al.: "Antenna and Wireless IC Device"; U.S. Appl. No. 13/083,626, filed Apr. 11, 2011.
Official Communication issued in International Patent Application No. PCT/JP2009/070617, mailed on Mar. 16, 2010.
Nagai, "Mounting Technique of RFID by Roll-To-Roll Process", Material Stage, Technical Information Institute Co., LTD, vol. 7, No. 9, 2007, pp. 4-12.
Dokai et al.: "Wireless IC Device"; U.S. Appl. No. 13/088,480, filed Apr. 18, 2011.
Kato et al.: "High-Frequency Device and Wireless IC Device"; U.S. Appl. No. 13/094,928, filed Apr. 27, 2011.
Dokai et al.: "Wireless IC Device"; U.S. Appl. No. 13/099,392, filed May 3, 2011.
Kato et al.: "Radio Frequency IC Device"; U.S. Appl. No. 13/163,803, filed Jun. 20, 2011.
Official Communication issued in International Patent Application No. PCT/JP2010/050170, mailed on Apr. 13, 2010.
Official Communication issued in International Patent Application No. PCT/JP2008/063025, mailed on Aug. 12, 2008.
Kato et al.: "Wireless IC Device," U.S. Appl. No. 12/603,608, filed Oct. 22, 2009.
Kato et al.: "Wireless IC Device," U.S. Appl. No. 12/688,072, filed Jan. 15, 2010.
Official Communication issued in International Patent Application No. PCT/JP2009/053693, mailed on Jun. 9, 2009.
Kato: "Composite Antenna," U.S. Appl. No. 12/845,846, filed Jul. 29, 2010.
Official Communication issued in International Patent Application No. PCT/JP2009/053690, mailed on Jun. 2, 2009.
Kato et al.: "Radio Frequency IC Device and Radio Communication System," U.S. Appl. No. 12/859,340, filed Aug. 19, 2010.
Official Communication issued in International Patent Application No. PCT/JP2009/055758, mailed on Jun. 23, 2009.
Kato et al.: "Wireless IC Device," U.S. Appl. No. 12/859,880, filed Aug. 20, 2010.
Official Communication issued in International Patent Application No. PCT/JP2009/057482, mailed on Jul. 21, 2009.
Kataya et al.: "Wireless IC Device, Electronic Apparatus, and Method for Adjusting Resonant Frequency of Wireless IC Device," U.S. Appl. No. 12/861,945, filed Aug. 24, 2010.
Kato: "Wireless IC Device and Electromagnetic Coupling Module," U.S. Appl. No. 12/890,895, filed Sep. 27, 2010.
Official Communication issued in International Patent Application No. PCT/JP2009/059410, mailed on Aug. 4, 2009.
Kato et al.: "Wireless IC Device" U.S. Appl. No. 12/902,174, filed Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP2009/056698, mailed on Jul. 7, 2009.

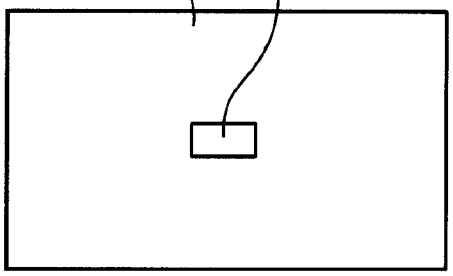
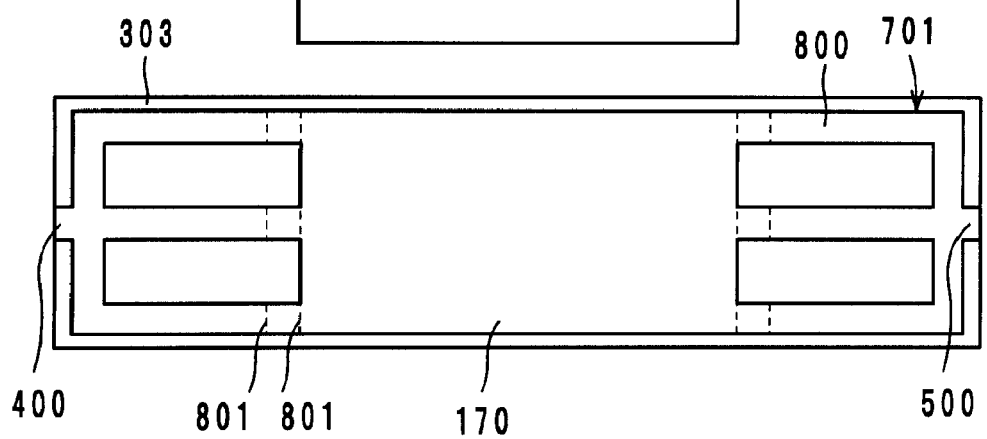
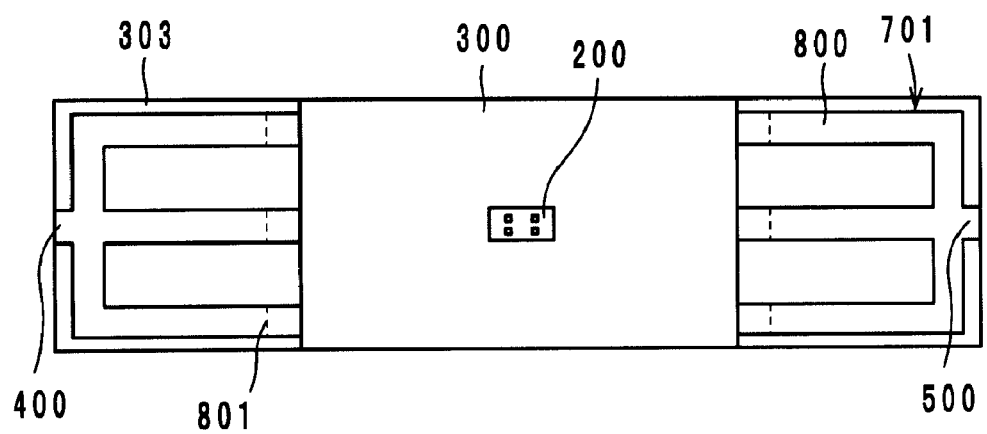

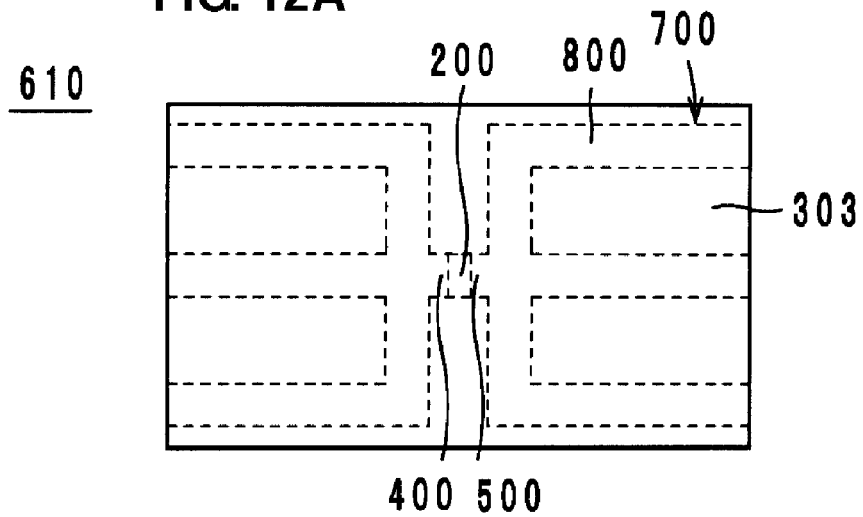
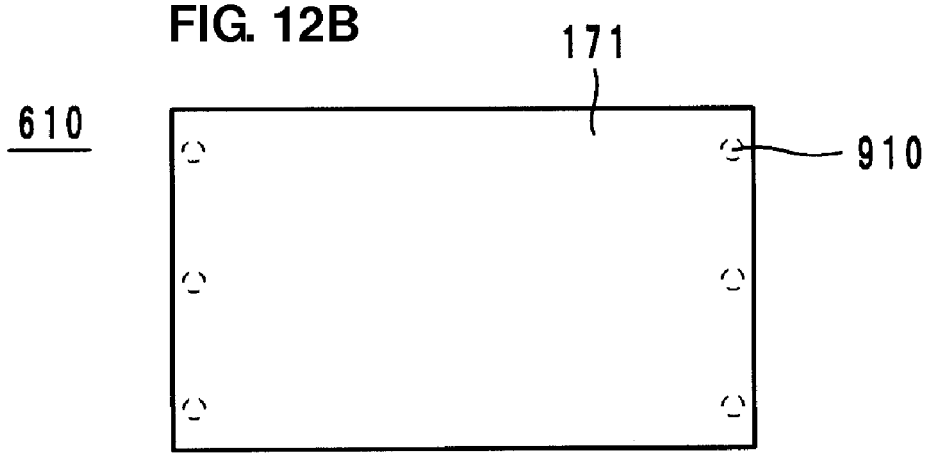
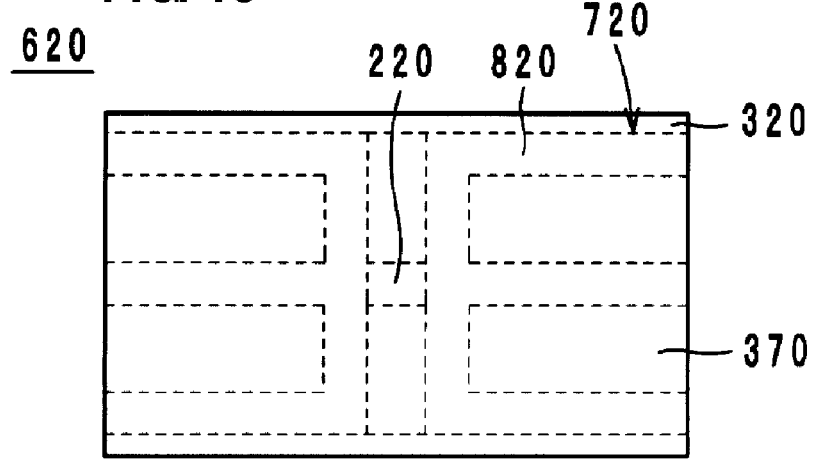

FIG. 15A
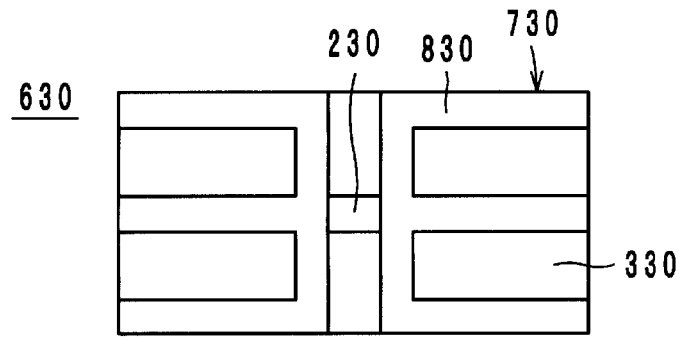
FIG. 15B
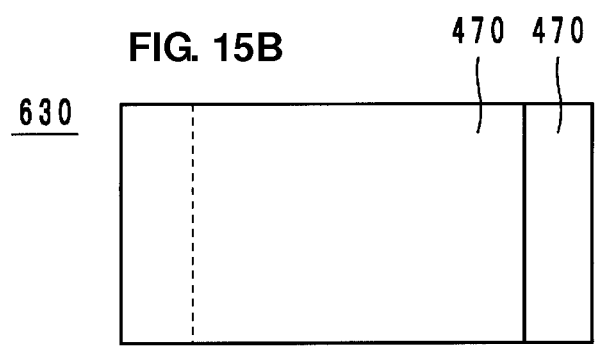
FIG. 16
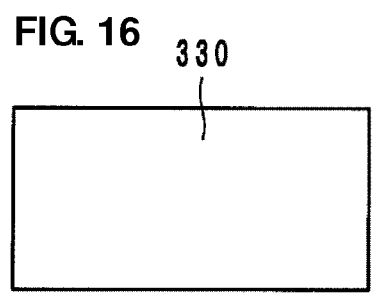
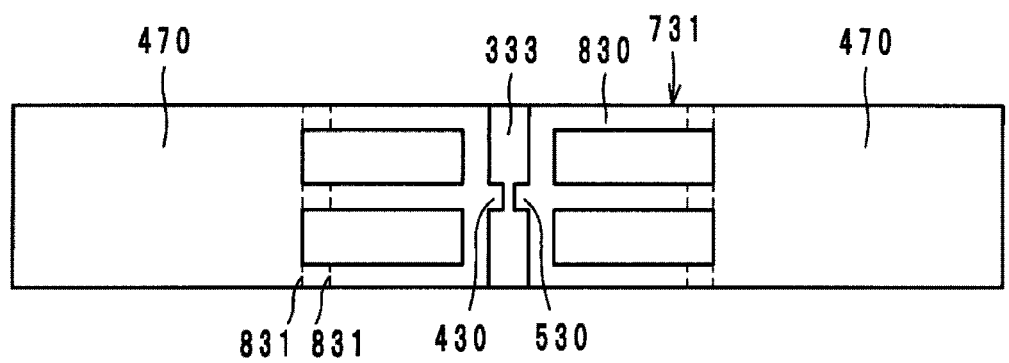

WIRELESS IC DEVICE, WIRELESS IC MODULE AND METHOD OF MANUFACTURING WIRELESS IC MODULE

BACKGROUND OF THE INVENTION

1. Field of the Invention

The present invention relates to wireless IC devices and in particular relates to a wireless IC device, a wireless IC module and a method of manufacturing a wireless IC module preferably for use in radio frequency identification (RFID) systems that perform communication of data in a non-contact manner.

2. Description of the Related Art

In recent years, wireless IC devices have been developed to include a wireless IC chip that electronically stores information for managing articles and processes predetermined radio signals, and an antenna that transmits and receives radio signals between the wireless IC chip and a reader/writer. Systems that use such wireless IC devices are referred to as RFID systems and can be used in authentication of individuals and transmission and reception of data by using in combination with each other a wireless IC device (taking the form of a card, tag, inlet or the like) and a reader/writer that reads and writes data from and to the wireless IC device.

In such a non-contact RFID system, when an article, which is a target to which a wireless IC device has been attached, contains metal, moisture, salt or the like, sometimes an eddy current is generated in the article and the antenna does not behave correctly due to the effect of the eddy current. That is, when an antenna is affixed to a surface of an article, there are cases where the transmission or reception of information contains errors or is not possible due to the electromagnetic waves being absorbed by the eddy current. This defect has been particularly prominent in wireless IC devices that operate in a high frequency band.

Accordingly, for example, there is a technique in which a magnetic member is disposed between the antenna and the article in wireless IC devices operating in a HF band as disclosed in Japanese Unexamined Patent Application Publication No. 2004-304370, Japanese Unexamined Patent Application Publication No. 2005-340759 and Japanese Unexamined Patent Application Publication No. 2006-13976. Furthermore, there is a technique in which the antenna is disposed so as to be spaced apart from the article in wireless IC devices operating in a UHF band, as disclosed in Japanese Unexamined Patent Application Publication No. 2007-172369 and Japanese Unexamined Patent Application Publication No. 2007-172527.

However, in the technique in which a magnetic member is disposed between the antenna and the article and in the technique in which the antenna is spaced apart from the article, there has been a problem in that the wireless IC device cannot be reduced in size and thickness, which are desired in order to apply the device in diverse applications.

SUMMARY OF THE INVENTION

Accordingly, preferred embodiments of the present invention provide a wireless IC device, a wireless IC module and a method of manufacturing a wireless IC module that can function as a component of a non-contact RFID system even when affixed to an article containing metal, moisture, salt or the like, while not sacrificing reductions in size and thickness.

A wireless IC device according to a first preferred embodiment of the present invention includes a wireless IC that processes predetermined radio signals; a radiation electrode that defines a radiating member; and a loop-shaped electrode that includes a plurality of perpendicular electrode portions that are perpendicular or substantially perpendicular to the plane of the radiation electrode, the loop-shaped electrode having a loop shape defined by an electrode including the perpendicular electrode portions, and the loop-shaped electrode being coupled with the wireless IC and the radiation electrode.

Furthermore, a wireless IC module according to a second preferred embodiment of the present invention includes a wireless IC that processes predetermined radio signals and a loop-shaped electrode that is coupled with the wireless IC; the loop-shaped electrode including a plurality of perpendicular electrode portions that are perpendicular or substantially perpendicular to a mounting surface of the wireless IC module.

Furthermore, according to a third preferred embodiment of the present invention, a method of manufacturing a wireless IC module that includes a wireless IC that processes predetermined radio signals and a loop-shaped electrode that is coupled with the wireless IC, includes: a step of preparing a metal plate that has been patterned to form a line-shaped electrode and a step of forming a loop-shaped electrode having a plurality of perpendicular electrode portions that are perpendicular or substantially perpendicular to a mounting surface of the wireless IC module by folding and wrapping the metal plate around the board.

Furthermore, according to a fourth preferred embodiment of the present invention, a method of manufacturing a wireless IC device that includes a wireless IC that processes predetermined radio signals and a loop-shaped electrode that is coupled with the wireless IC, includes: a step of preparing a metal plate that has been patterned to form a line-shaped electrode; a step of forming a loop-shaped electrode including a plurality of perpendicular electrode portions that are perpendicular to a mounting surface of the wireless IC module by folding and wrapping the metal plate around the board; and a step of subjecting the folded metal plate to molding using a resin.

With the wireless IC device, in the loop-shaped electrode, which is coupled with the wireless IC and the radiation electrode, since the perpendicular electrode portions included in the loop-shaped electrode are perpendicular or substantially perpendicular to the radiation electrode, a magnetic field is generated parallel or substantially parallel to the radiation electrode. As a result, an electric field is induced perpendicular or substantially perpendicular to the radiation electrode, magnetic field loops are induced by the electric field loops thereof, and the electromagnetic field distribution extends in a chain.

Furthermore, since a plurality of the perpendicular electrode portions are provided, a strong magnetic field is generated and communication can be performed with a high gain.

According to various preferred embodiments of the present invention, while maintaining reductions in size and thickness, a wireless IC device and/or a wireless IC module can function as a component of a non-contact RFID system even when mounted on an article containing metal, moisture, salt or the like.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1A is a plan view, FIG. 1B is a bottom surface view, FIG. 1C is a sectional view taken along line I-I of FIG. 1A, and FIG. 1D is a sectional view taken along line II-II of FIG. 1A.

FIG. 1A is a plan view, FIG. 1B is a bottom surface view and FIG. 1C is a sectional view taken along line III-III of FIG. 1A.

FIG. 10A is a plan view, FIG. 10B is a bottom surface view and FIG. 10C is a side surface view.

FIGS. 11A-11C illustrate steps of a method of manufacturing the wireless IC module according to the third preferred embodiment of the present invention.

FIGS. 12A and 12B illustrate a modified example of the wireless IC module according to the third preferred embodiment, where FIG. 12A is a plan view and FIG. 12B is a bottom surface view.

FIG. 13 illustrates a wireless IC module according to a fourth preferred embodiment of the present invention.

FIGS. 15A and 15B illustrate a wireless IC module according to a fifth preferred embodiment, where FIG. 15A is a plan view and FIG. 15B is a bottom surface view.

FIG. 16 illustrates a method of manufacturing the wireless IC module according to the fifth preferred embodiment of the present invention.

FIG. 18A is a plan view, FIG. 18B is a bottom surface view, FIG. 18C is a sectional view taken along line IV-IV of FIG. 18A, and FIG. 18D is a sectional view taken along line V-V of FIG. 18A.

DETAILED DESCRIPTION OF THE PREFERRED EMBODIMENTS

Hereafter, wireless IC modules, wireless IC devices and methods of manufacturing a wireless IC module according to various preferred embodiments of the present invention will be described in detail with reference to the drawings. In each of the figures, common components and parts will be denoted by the same symbols and repeated description thereof will be omitted.

First Preferred Embodiment

Figure 1A:
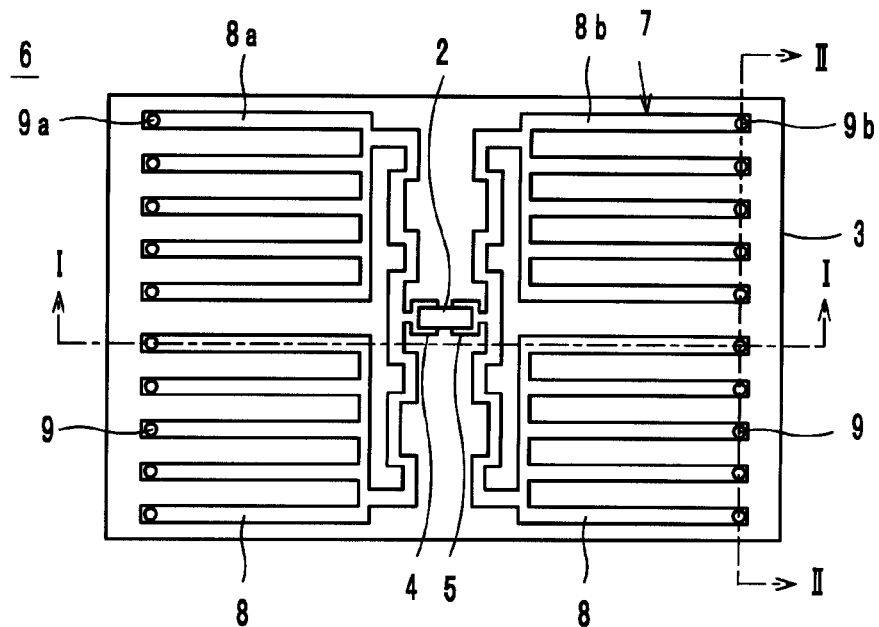
FIGS. 1A-1D illustrate a wireless IC module according to a first preferred embodiment, where
Figure 1B:
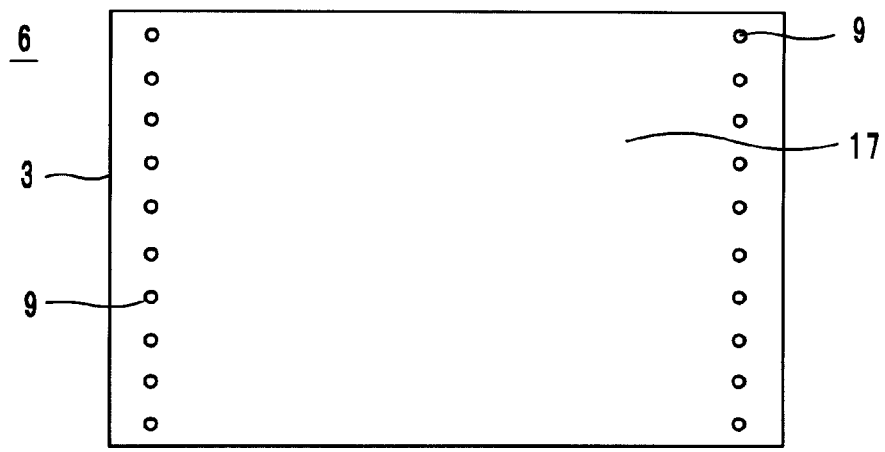
Figure 1C:
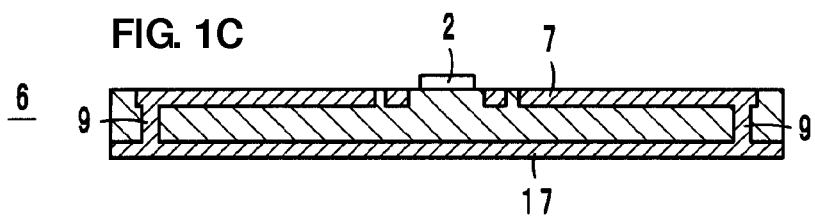
Figure 1D:
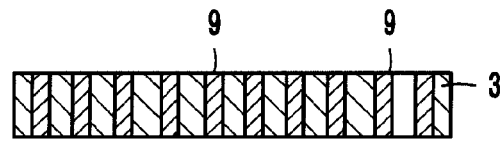

FIGS. 1A-1D illustrate a wireless IC module 6 according to a first preferred embodiment, where FIG. 1A is a plan view, FIG. 1B is a bottom surface view, FIG. 1C is a sectional view taken along line I-I of FIG. 1A, and FIG. 1D is a sectional view taken along line II-II of FIG. 1A.

A wireless IC module 6 includes a wireless IC 2 that processes predetermined radio signals and loop-shaped electrodes 7. The wireless IC 2 is disposed on two-end coupling portions 4 and 5 of the loop-shaped electrodes 7, and the wireless IC 2 and the loop-shaped electrodes 7 are electromagnetically coupled with each other. The wireless IC 2 and the loop-shaped electrodes 7 may instead be directly electrically connected with each other (DC connection).

The loop-shaped electrodes 7, include electrodes, that is, the two-end coupling portions 4 and 5 and line-shaped electrodes 8 located on a board 3, via hole conductors 9 formed through the board 3 and a common electrode 17 located on the bottom surface of the board 3. The line-shaped electrodes 8 and the via hole conductors 9 are symmetrically arranged on the board on the left and right with the two-end coupling portions 4 and 5 interposed therebetween. For example, the electrodes circle in a loop as the coupling portion 5→line-shaped electrodes 8b→via hole conductors 9b→the common electrode 17→via hole conductors 9a→line-shaped electrodes 8a→the coupling portion 4 and thus form the loop-shaped electrodes 7. In this preferred embodiment, the bottom surface of the wireless IC module 6 includes the common electrode 17 located thereon and serves as a mounting surface to be mounted onto an article. The via hole conductors 9 are perpendicular or substantially perpendicular to the mounting surface of the wireless IC module 6 and therefore the via hole conductors 9 serve as perpendicular electrode portions.

As described above, the loop-shaped electrodes 7 include the two-end coupling portions 4 and 5, the line-shaped electrodes 8, the via hole conductors 9 and the common electrode 17, and since a plurality of the line-shaped electrodes 8 and the via hole conductors 9 are provided, a plurality of the loop-shaped electrodes 7 are also provided. In other words, a plurality of the line-shaped electrodes 8 and a plurality of the via hole conductors 9 are provided on the left and right respectively with the coupling portions 4 and 5 interposed therebetween on the board 3, and the plurality of line-shaped electrodes 8 on the left and right are arranged parallel or substantially parallel with one another. The plurality of line-shaped electrodes 8 are connected in parallel with one another on the left and right, are connected to the two-end coupling portions 4 and 5, and are coupled with the wireless IC 2. Furthermore, the plurality of line-shaped electrodes 8 are connected to the common electrode 17 located on the bottom surface of the board 3 via the plurality of via hole conductors 9. Thus, the loop-shaped electrodes 7 define a plurality of loops.

Figure 2:
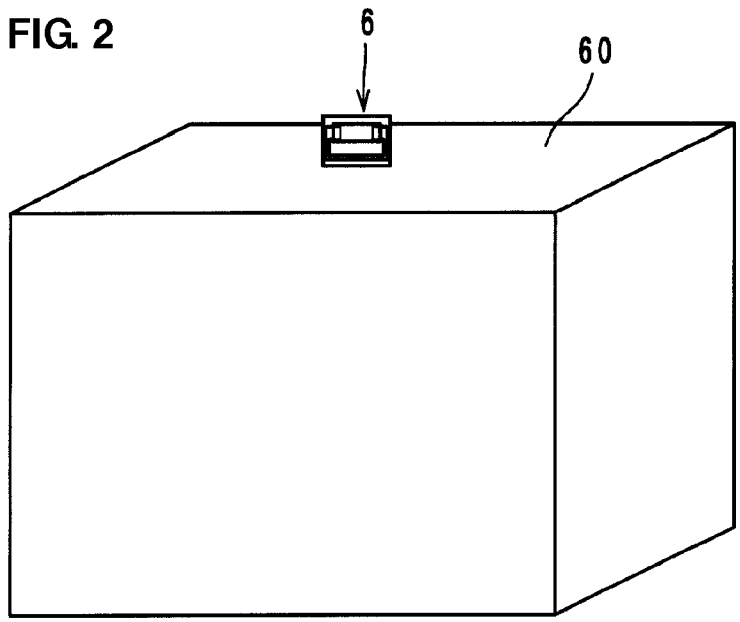
FIG. 2 illustrates the structure of the wireless IC module according to the first preferred embodiment and that of an article equipped therewith.
Figure 3:
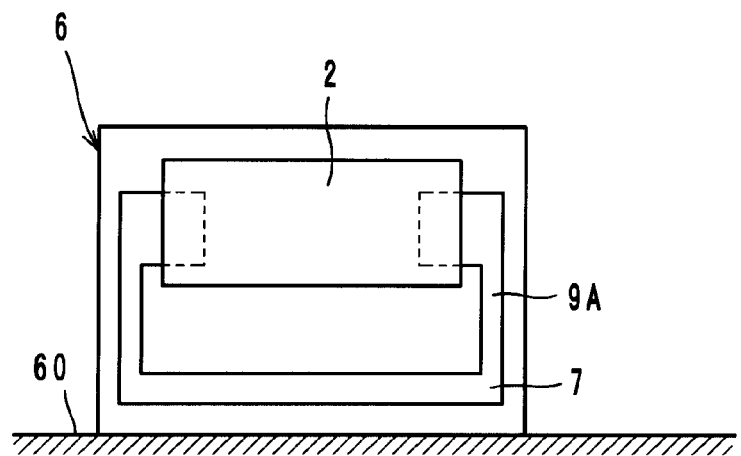
FIG. 3 is an enlarged view of the main portion of the wireless IC module illustrated in FIG. 2.

FIG. 2 is a view in which the wireless IC module 6 has been attached to a predetermined surface of a metal article 60. FIG. 3 is an enlarged view of the wireless IC module 6. In FIG. 2 and FIG. 3, the wireless IC module 6 is illustrated in a schematic manner. For example, in FIG. 2 and FIG. 3, only a single loop-shaped electrode 7 is schematically illustrated, whereas in reality there are a plurality of the loop-shaped electrodes 7. As illustrated in FIG. 3, perpendicular electrode portions 9A of the loop-shaped electrode 7 are perpendicular or substantially perpendicular to the mounting surface of the wireless IC module 6 and therefore the perpendicular electrode portions 9A of the loop-shaped electrode 7 are disposed so as to be oriented perpendicular or substantially perpendicular to the metal article 60.

Figure 4:
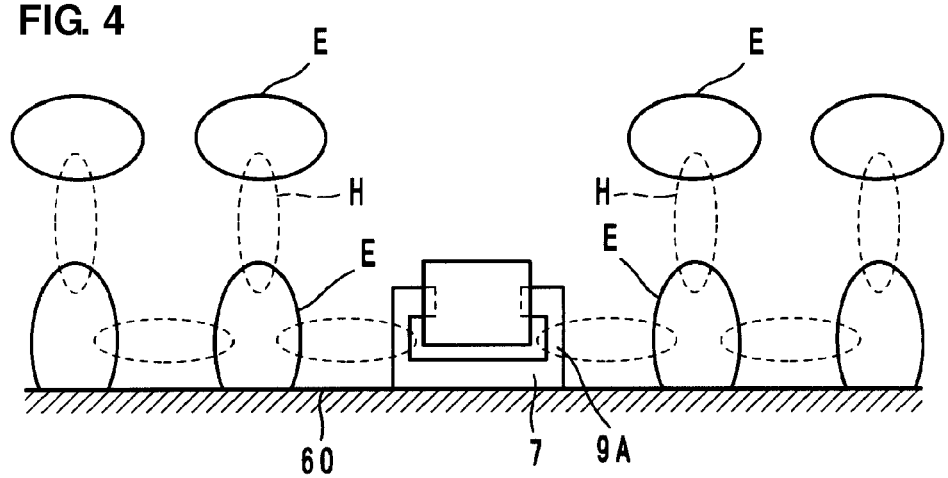
FIG. 4 is an outline view illustrating the distribution of the electromagnetic field in the vicinity of the wireless IC module on a surface of the metal article illustrated in FIG. 2.

Here, the operating principle of the wireless IC module 6 will be described with reference to FIG. 4. FIG. 4 schematically illustrates the distribution of the electromagnetic fields (magnetic fields H, electric fields E) generated by the loop-shaped electrode 7. The dashed lines in the figure show the loops of the magnetic fields H and the solid lines show the loops of the electric fields E.

The loop-shaped electrode 7 functions as a magnetic field antenna. The magnetic fields H are generated parallel or substantially parallel to the surface of the metal article 60 by the perpendicular electrode portions 9A of the loop-shaped electrode 7, and the electric fields E that are perpendicular or substantially perpendicular to the surface of the metal article 60 is induced. Magnetic field loops are induced by these electric field loops and the electromagnetic field distribution extends through this chain.

In the above-described example, the loop-shaped electrode 7 was described as preferably being a transmission antenna, but the loop-shaped antenna operates in a similar way when serving as a reception antenna, due to the reversibility of antennas. In other words, the electromagnetic fields induce magnetic field loops, these magnetic field loops induce electric fields E that are perpendicular or substantially perpendicular to the surface of the metal article 60, these electric fields E cause magnetic fields H to be generated parallel or substantially parallel to the surface of the metal article 60 and couple with the loop-shaped electrode 7.

In this way, the wireless IC module 6 can function as an element of an RFID system even when the wireless IC module 6 is mounted on a metal article. In other words, the wireless IC module 6 can cause the surface of the metal article 60 to function as a radiating plate. In addition, even when the article on which the wireless IC module 6 is mounted is an electrolyte such as blood, miso, a saline solution or soap, the wireless IC module 6 functions in the same way. In addition, when the article is a metal or an electrolyte, an electric current can pass through the surface of the article and therefore transmission and reception can be performed from the side opposite to the surface on which the wireless IC module is mounted.

In addition, a plurality of the loop-shaped electrodes 7 are provided and the electrodes have a plurality of perpendicular electrode portions 9A and therefore the strength of the magnetic fields H generated is high. Therefore, the strength of the electromagnetic fields induced is also high and transmission and reception can be performed with a high gain.

Furthermore, the greater the number of loop-shaped electrodes 7, the more the gain can be improved. This is because the greater the number of loop-shaped electrodes 7 there are, the stronger the magnetic fields generated are and the stronger the magnetic fields received are. In addition, similarly, the larger the width of the loop-shaped electrodes 7, the more the gain can be improved. However, it is preferable that gaps of at least a certain size be provided between the plurality of loop-shaped electrodes 7 to ensure through paths for the magnetic fields.

Furthermore, since the common electrode 17 is provided on the bottom surface of the board, even when the wireless IC module 6 is mounted on the metal article 60, it is not likely that a floating capacitance will be generated between the wireless IC module 6 and the metal article 60 and the characteristics of the wireless IC module 6 can be prevented from changing.

Next, an example of a method of manufacturing the wireless IC module 6 according to the present preferred embodiment will be described.

In this preferred embodiment, first, conductive paste is printed and patterned on the board 3, which is composed of glass, epoxy or the like, and thus the two-end coupling portions 4 and 5 and the plurality of line-shaped electrodes 8 are formed on the front surface of the board 3 and the common electrode 17 is formed on the back surface. Thereafter, via holes that penetrate through the board 3 are formed in the places where the line-shaped electrodes 8 were formed and the via hole conductors 9 are formed by filling the via holes with conductive paste. The loop-shaped electrodes 7 formed on the front surface of the board 3 and the common electrode 17 formed on the back surface of the board 3 are connected to each other through the via hole conductors 9.

Then, the wireless IC module 6 is completed by disposing the wireless IC 2 on the coupling portions 4 and 5 of the loop-shaped electrodes 7.

Hereafter, the wireless IC 2 will be described.

Figure 5:
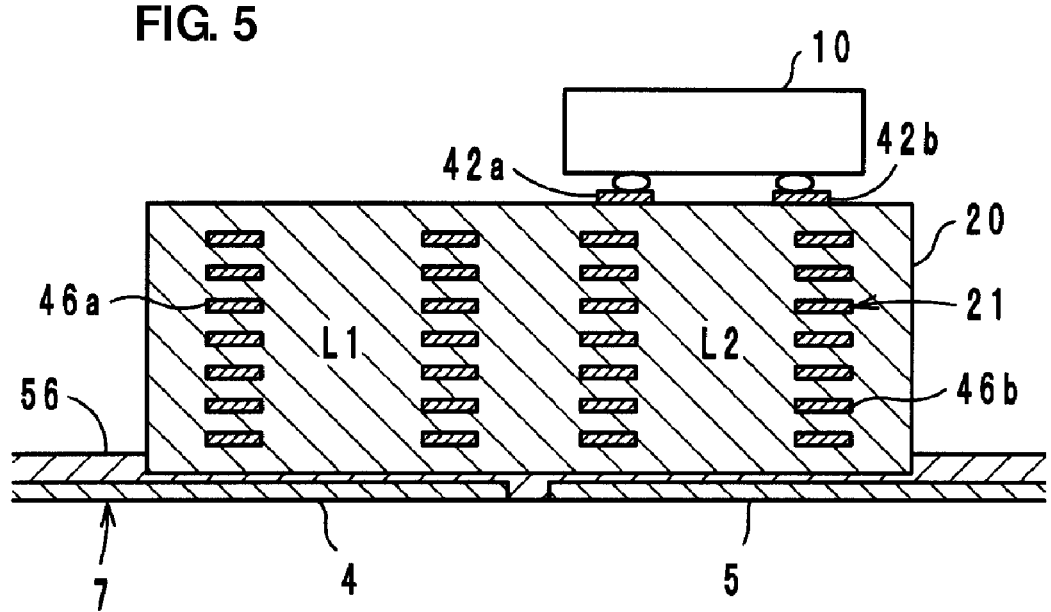
FIG. 5 illustrates a wireless IC of the wireless IC module according to the first preferred embodiment of the present invention.

As illustrated in FIG. 5, the wireless IC 2 includes a wireless IC chip 10 and a feeder circuit board 20. The wireless IC chip 10 includes a clock circuit, a logic circuit, a memory circuit and the like and stores necessary information. The wireless IC chip 10 is provided with a pair of input/output terminal electrodes and a pair of mounting terminal electrodes on the back surface thereof. The input/output terminal electrodes are electrically connected to feeder terminal electrodes 42a and 42b (refer to FIG. 6) provided on the feeder circuit board 20 through metal bumps or the like and the mounting terminal electrodes are electrically connected to mounting electrodes 43a and 43b (refer to FIG. 6) through metal bumps or the like. Inductance elements L1 and L2 are provided in the feeder circuit board 20 and the feeder circuit board 20 is affixed by resin adhesive 56 such that the inductance elements respectively face the two-end coupling portions 4 and 5 of the loop-shaped electrodes 7.

The inductance elements L1 and L2 broaden the frequency band by being magnetically coupled in a reversed phase with each other, resonate at a frequency processed by the wireless IC chip 10 and are electromagnetically coupled with the loop-shaped electrodes 7. In addition, a feeder circuit 21 attempts to match the impedance of the wireless IC chip 10 and the impedance of the metal article 60 on which the wireless IC module 6 is mounted.

Therefore, the feeder circuit board 20 transmits a transmission signal having a predetermined frequency and originating from the wireless IC chip 10 (for example, a signal of a UHF frequency band) to the metal article 60 and selects a reception signal having a predetermined frequency from among signals received by the metal article 60 and supplies the selected signal to the wireless IC chip 10. Therefore, in the wireless IC module 6, the wireless IC chip 10 operates due to a signal received by the metal article 60 and a response signal from the wireless IC chip 10 is radiated from the metal article 60 to the outside.

Figure 6:
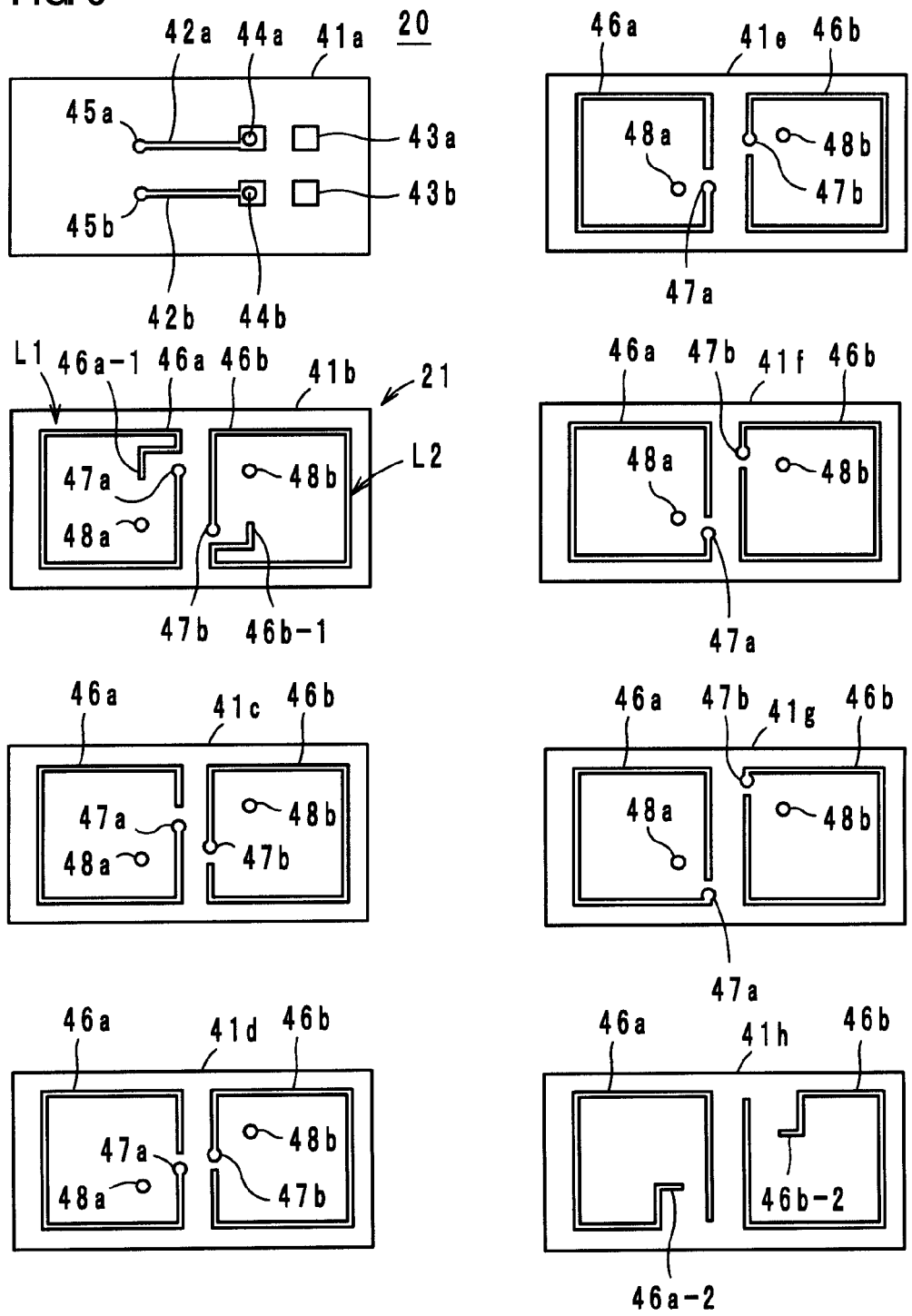
FIG. 6 is an exploded view illustrating the multilayer structure of a feeder circuit board of the wireless IC module according to the first preferred embodiment of the present invention.

As illustrated in FIG. 6, the feeder circuit board 20 is formed preferably by stacking on top of one another, compression-bonding together and firing ceramic sheets 41a to 41h composed of a dielectric or magnetic material. The feeder terminal electrodes 42a and 42b, the mounting electrodes 43a and 43b, and via hole conductors 44a, 44b, 45a and 45b are formed on and through the uppermost sheet 41a. Wiring electrodes 46a and 46b that respectively form the inductance elements L1 and L2 and necessary via hole conductors 47a, 47b, 48a and 48b are formed on and through the second to eighth sheets 41b to 41h.

The sheets 41a to 41h are stacked on top of one another and thereby the inductance element L1 is formed in which the wiring electrodes 46a are connected to one another in a spiral shape through the via hole conductors 47a and the inductance element L2 is formed in which the wiring electrodes 46b are connected to one another in a spiral shape through the via hole conductors. In addition, capacitances are formed between the lines of the wiring electrodes 46a and 46b.

An end 46a-1 of the wiring electrode 46a on the sheet 41b is connected to the feeder terminal electrode 42a through the via hole conductor 45a and an end 46a-2 of the wiring electrode 46a on the sheet 41h is connected to the feeder terminal electrode 42b through the via hole conductors 48a and 45b. An end 46b-1 of the wiring electrode 46b on the sheet 41b is connected to the feeder terminal electrode 42b through the via hole conductor 44b and an end 46b-2 of the wiring electrode 46b on the sheet 41h is connected to the feeder terminal electrode 42a through the via hole conductors 48b and 44a.

In the above-described feeder circuit 21, the inductance elements L1 and L2 loop in opposite directions and therefore the magnetic fields generated by the inductance elements L1 and L2 cancel each other out. Since the magnetic fields cancel each other out, it is necessary to increase the length of the wiring electrodes 46a and 46b by a certain amount in order to obtain the desired inductance value. Thus, since the Q value is small, the slope of the resonance characteristic is small and the band is broadened in the vicinity of the resonant frequency.

The inductance elements L1 and L2 are formed at different lateral positions when the feeder circuit board 20 is viewed in plan in a transparent manner. Furthermore, the magnetic fields generated by the inductance elements L1 and L2 are in opposite directions to each other. Thus, when the feeder circuit 21 is coupled with the coupling portions 4 and 5 of the loop-shaped electrodes 7, currents are excited in opposite directions in the coupling portions 4 and 5 and a signal can be transmitted or received through the loop-shaped electrodes 7. The inductance elements L1 and L2 may be electrically connected to the coupling portions 4 and 5.

The feeder circuit board 20 may be a multilayer board composed of a ceramic or a resin, or may be a board formed by stacking flexible sheets composed of a dielectric such as polyimide or a liquid crystal polymer on top of one another. In particular, the inductance elements L1 and L2 are built into the feeder circuit board 20 and as a result it is unlikely that the feeder circuit 21 will be affected by conditions external to the board and fluctuations in the radiation characteristics can be prevented.

In the wireless IC 2, the feeder circuit board 20 is not necessarily required and the wireless IC chip may simply be used as the wireless IC 2. In this case, the wireless IC chip is directly coupled with the coupling portions 4 and 5 of the loop-shaped electrodes 7. In addition, the wireless IC 2 may be a wireless IC chip in which a feeder circuit has been included, for example.

Second Preferred Embodiment

Figure 7A:
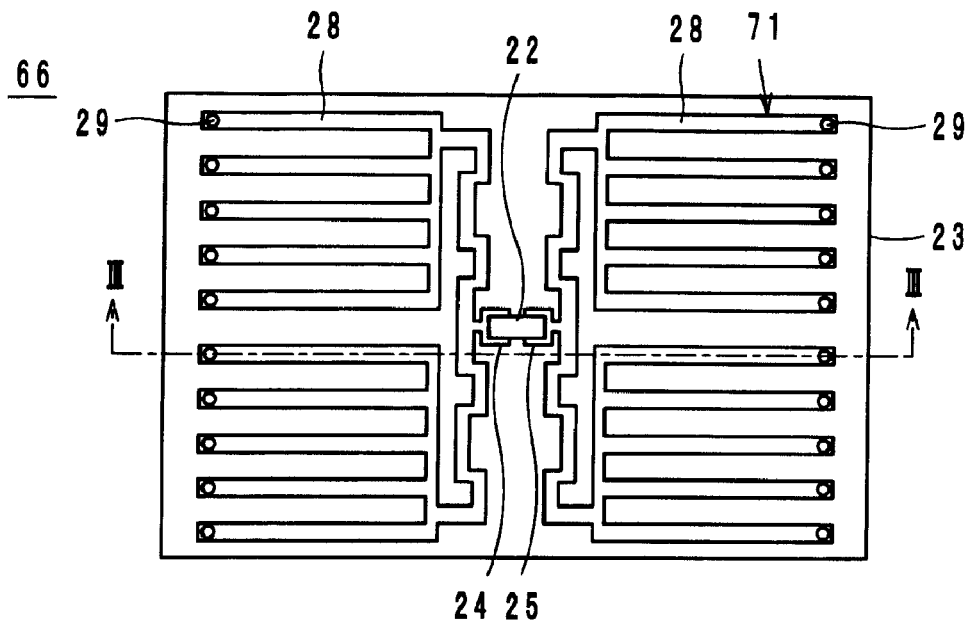
FIG. 7A-7C illustrate a wireless IC module according to a second preferred embodiment, where
Figure 7B:
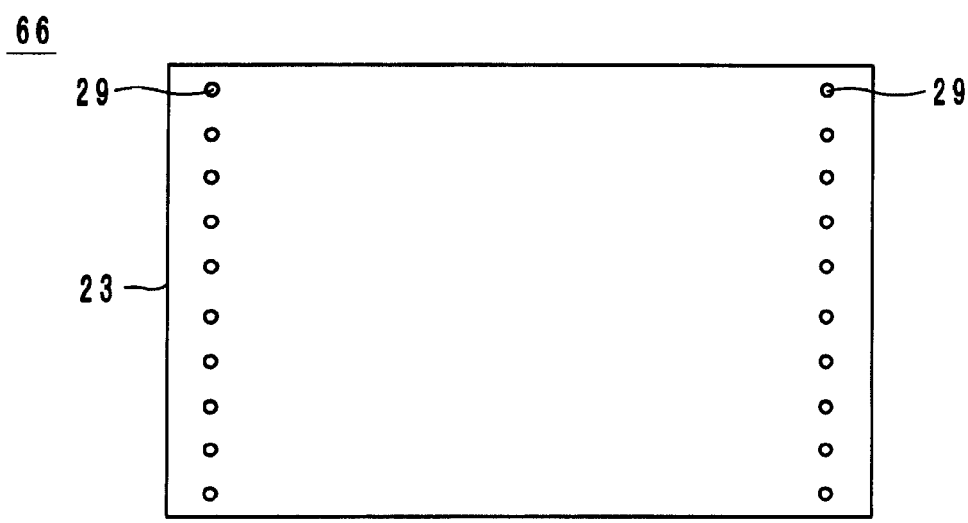
Figure 7C:
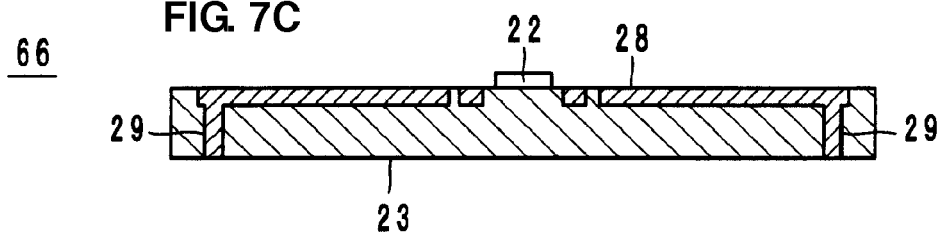

FIGS. 7A-7C illustrates a wireless IC module 66 according to a second preferred embodiment, where FIG. 7A is plan view, FIG. 7B is a bottom surface view and FIG. 7C is a sectional view taken along line III-III of FIG. 7A.

The wireless IC module 66 according to the second preferred embodiment, similarly to as in the first preferred embodiment, includes a wireless IC 22, two-end coupling portions 24 and 25, a plurality of line-shaped electrodes 28 and via hole conductors 29. The two-end coupling portions 24 and 25, the plurality of line-shaped electrodes 28 and the via hole conductors 29 are formed on and through a board 23. However, in contrast to the first preferred embodiment, the wireless IC module 66 does not have a common electrode on the back surface of the board 23, which is the mounting surface thereof. Therefore, the two-end coupling portions 24 and 25, the plurality of line-shaped electrodes 28 and the via hole conductors 29 define loop-shaped electrode portions 71, which form a portion of loop-shaped electrodes.

Figure 8:
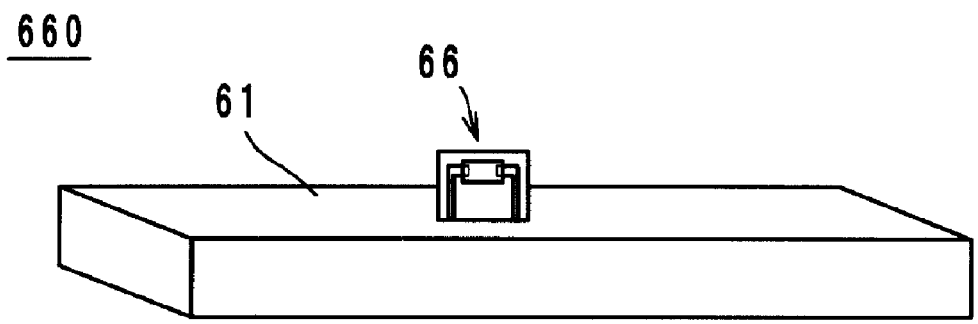
FIG. 8 illustrates a wireless IC device according to the second preferred embodiment of the present invention.
Figure 9:
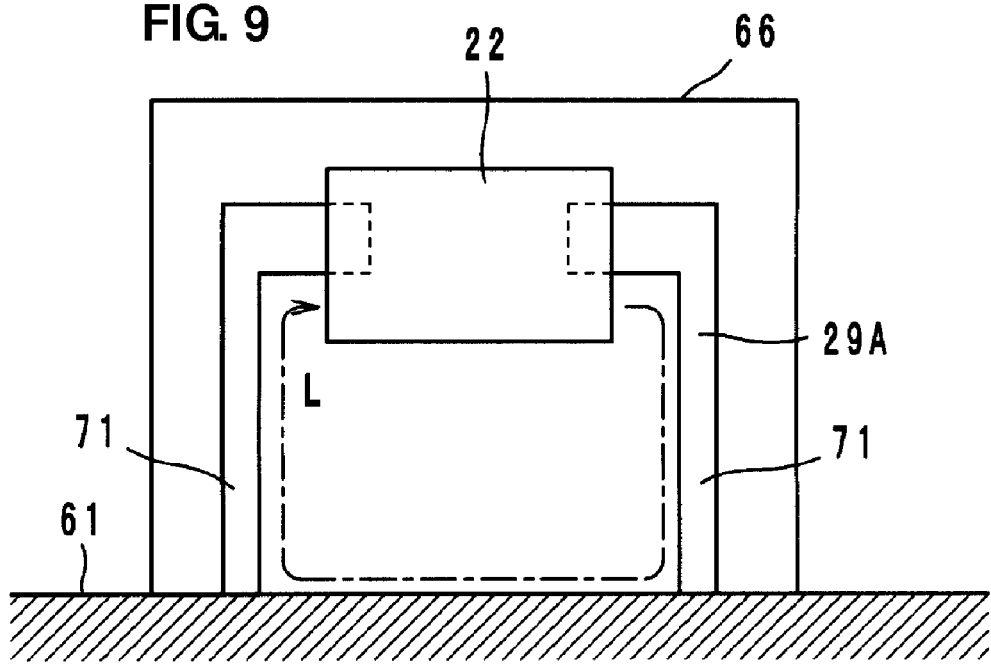
FIG. 9 is an enlarged view of the main portion of the wireless IC device illustrated in FIG. 8.

As illustrated in FIG. 8, by attaching the wireless IC module 66 to a predetermined surface of a metal article 61, a wireless IC device 660 is provided. The wireless IC module 66 is attached to the metal article 61 and thereby the via hole conductors 29 and the metal surface of the metal article 61 are put into direct electrical conductive contact with each other. The metal surface of the metal article 61 is a radiation electrode that functions as a radiating member. Thus, the metal surface of the metal article 61 also doubles as a portion of the loop-shaped electrodes. In other words, the loop-shaped electrodes are defined by the loop-shaped electrode portions 71 and the surface of the metal article 61 as illustrated by L in the figure, and are coupled with the wireless IC. The via hole conductors 29 included in the loop-shaped electrodes are perpendicular electrode portions 29A arranged so as to be substantially perpendicular to the metal surface of the metal article 61.

Also in the case of this structure, the loop-shaped electrodes defined by the loop-shaped electrode portions 71 and the surface of the metal article 61 function as magnetic-field antennas, are coupled with the metal article 61, and the surface of the metal article 61 functions as the radiating member of an antenna through behavior which is the same as that illustrated in FIG. 4.

Since a plurality of the loop-shaped electrodes are provided and the loop-shaped electrodes have a plurality of perpendicular electrode portions 29A, transmission and reception can be performed with a high gain, as in the first preferred embodiment.

Third Preferred Embodiment

Figure 10A:
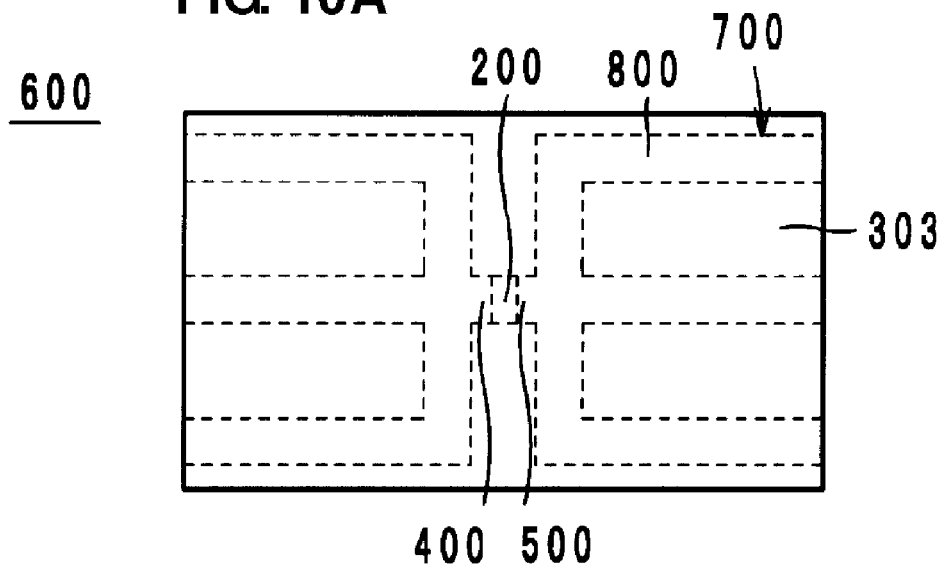
FIGS. 10A-10C illustrate a wireless IC module according to a third preferred embodiment, where
Figure 10B:
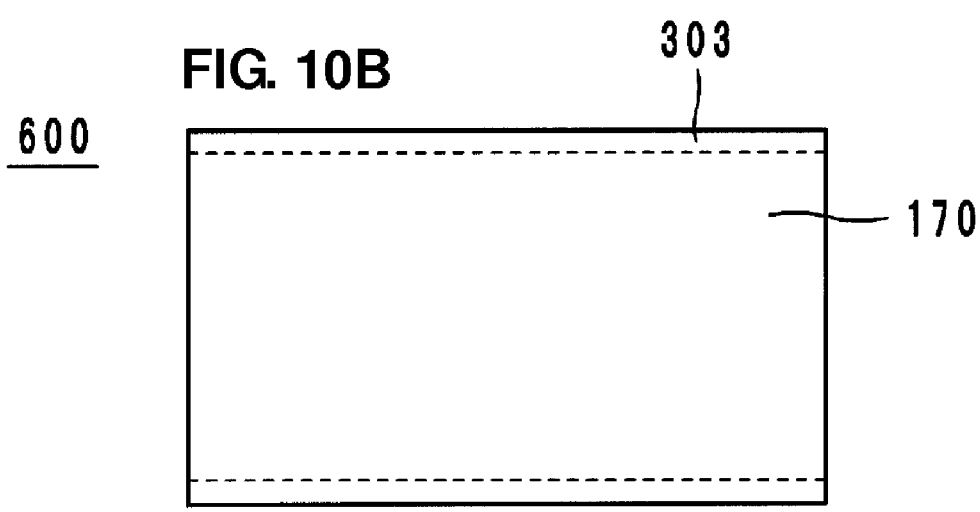
Figure 10C:
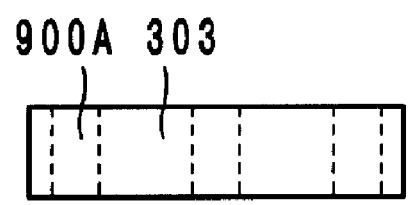

FIGS. 10A-10C illustrates a wireless IC module 600 according to a third preferred embodiment, where FIG. 10A is a plan view, FIG. 10B is a bottom surface view and FIG. 10C is a side surface view.

The wireless IC module 600 according to the third preferred embodiment, similarly to as in the first preferred embodiment, includes a wireless IC 200, two-end coupling portions 400 and 500, a plurality of line-shaped electrodes 800 and a common electrode 170, but in contrast to in the first preferred embodiment the components are covered by a polyethylene terephthalate (PET) film 303 and therefore are indicated using dashed lines. Furthermore, the wireless IC module 600 does not include via hole conductors. Accordingly, the line-shaped electrodes 800 are connected to the common electrode 170 along side surfaces of a board 300. In other words, loop-shaped electrodes 700 include the two-end coupling portions 400 and 500, the line-shaped electrodes 800 and the common electrode 170, which are electrodes.

In the wireless IC module 600, the line-shaped electrodes 800 arranged perpendicular or substantially perpendicular to the bottom surface of the board 300, which is a mounting surface, are perpendicular electrode portions 900A, and therefore even when the article upon which the wireless IC module 600 is mounted is composed of a metal, the wireless IC module 600 can function as an element of an RFID system. Furthermore, since a plurality of the loop-shaped electrodes 700 are provided and there are a plurality of the perpendicular electrode portions 900A, communication can be performed with a high gain.

A method of manufacturing the wireless IC module 600 according to the third preferred embodiment will now be described with reference to FIG. 11.

First, as illustrated in FIG. 11A, the board 300, which for example is a polyethyleneimine (PEI) board and in which the depression 301, into which the wireless IC 200 is to be disposed, is formed, and the vapor-deposited PET film 303 on which a metal thin film has been patterned, are prepared.

In a metal plate 701, which is the metal thin film on the PET film 303, the two-end coupling portions 400 and 500, the plurality of line-shaped electrodes 800 and the common electrode 170 are formed, these components later forming the loop-shaped electrodes. In order to facilitate folding, in the plurality of line-shaped electrodes 800, folding portions 801 are formed at positions to be contacted with the edges of the board 300.

Next, as illustrated in FIG. 11B, the board 300 is arranged on the PET film 303. Specifically, the board 300 is disposed on the common electrode 170. Then, the wireless IC 200 is disposed in the depression 301 in the board 300. At this time, in order to mount (bond) the wireless IC 200 and the metal plate 701, terminals of the wireless IC 200 may be oriented upward.

Then, the PET film 303 is folded so as to enclose the board 300. Thus, the metal plate 701 is folded to form a loop and the loop-shaped electrodes 700 are thus formed. Then, the wireless IC module 600 is completed by mounting (bonding) the two-end coupling portions 400 and 500 and the terminals of the wireless IC 200.

By using this method, the wireless IC module can be formed using a simple method.

In the above-described manufacturing method, the PET film 303 is folded such that the metal plate 701 contacts the board 300, but instead the PET film 303 may be folded such that the metal plate 701 faces the outside. In this case, the common electrode 170 comes to be formed on the bottom surface of the board 300 and therefore formation of a floating capacitance between the wireless IC module 600 and the metal article is prevented.

FIGS. 12A and 12B illustrate a wireless IC module 610, which is a modified example of the wireless IC module 600 according to the third preferred embodiment, where FIG. 12A is a plan view and FIG. 12B is a bottom surface view.

The wireless IC module 610 is substantially the same as that of the third preferred embodiment, but as illustrated in FIG. 12B, a secondary electrode 171 is provided on the back surface thereof. The secondary electrode 171 is connected to the common electrode 170 through via hole conductors 910 formed through the PET film 303.

Thus, formation of a floating capacitance between the wireless IC module 610 and the metal article is prevented by forming the secondary electrode 171 on the back surface of the wireless IC module 610.

Fourth Preferred Embodiment

FIG. 13 illustrates a wireless IC module 620 according to a fourth preferred embodiment.

The wireless IC module 620 according to the fourth preferred embodiment, similarly to as in the third preferred embodiment, includes a wireless IC 220, a plurality of line-shaped electrodes 820 and a common electrode 370. However, in contrast to the third preferred embodiment, the components of the wireless IC module 620 are subjected to molding using a resin 320. Accordingly, the wireless IC 220, the plurality of line-shaped electrodes 820 and the common electrode 370 are indicated by dashed lines.

Also in the wireless IC module 620, loop-shaped electrodes 720 include the two-end coupling portions, which are not illustrated in FIG. 13, the plurality of line-shaped electrodes 820 and the common electrode 370. The line-shaped electrodes 820 arranged perpendicular or substantially perpendicular to the bottom surface, which is the mounting surface of the wireless IC module 620, are perpendicular electrode portions and thus even when the article upon which the wireless IC module 620 is mounted is composed of metal, the wireless IC module 620 can function as an element of an RFID system. Furthermore, since a plurality of the loop-shaped electrodes 720 are provided and there are a plurality of perpendicular electrode portions, communication can be performed with a high gain.

A method of manufacturing the wireless IC module 620 according to the fourth preferred embodiment will be described with reference to FIGS. 14A-14C.

Figure 14A:
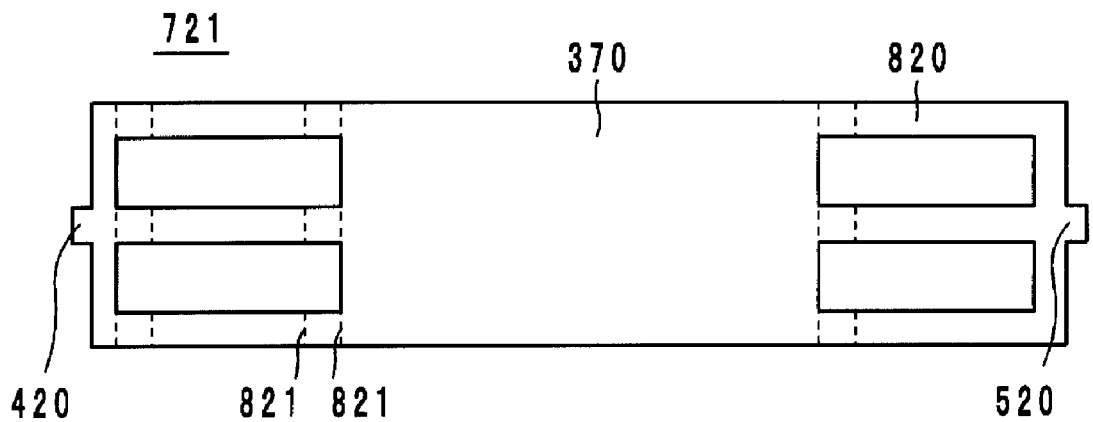
FIGS. 14A-14C illustrate steps of a method of manufacturing the wireless IC module according to the fourth preferred embodiment of the present invention.

First, as illustrated in FIG. 14A, a metal plate 721 having a thickness on the order of about 15 μm to about 150 μm (phosphor bronze, known as a hoop material can be suitably used or aluminum may be used) is patterned by being subjected to a punching process, an etching process or the like. The metal plate 721 is to form the loop-shaped electrodes 720 after being subjected to processing and therefore includes the two-end coupling portions 420 and 520, the plurality of line-shaped electrodes 820 and the common electrode 370. To facilitate folding, folding portions 821 are formed in the plurality of line-shaped electrodes 820.

Figure 14B:
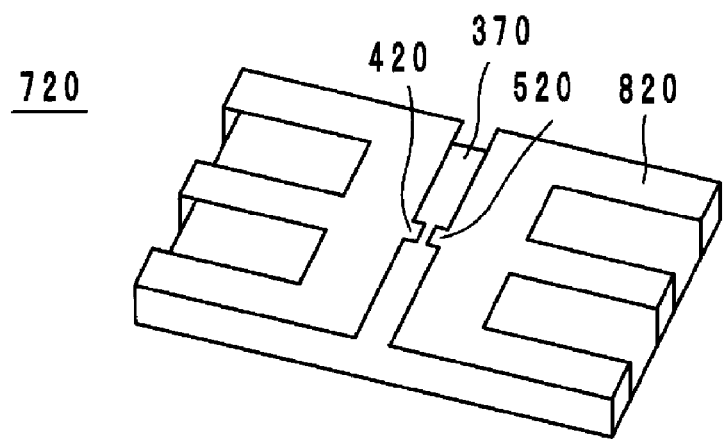

Next, as illustrated in FIG. 14B, the loop-shaped electrodes 720 are formed by folding the metal plate 721 into a loop.

Figure 14C:
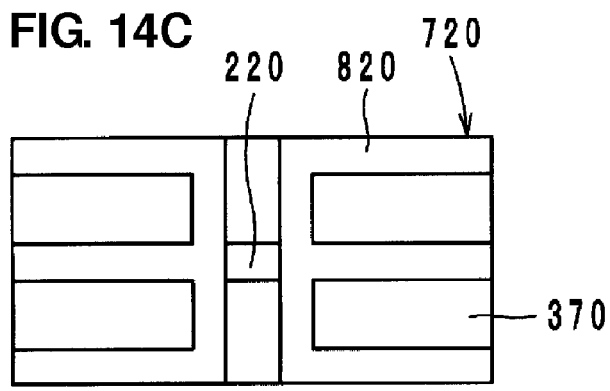

Next, as illustrated in FIG. 14C, the wireless IC 220 is mounted (bonded) onto the coupling portions 420 and 520 of the loop-shaped electrodes 720. Then, the wireless IC module 620 is completed by subjecting the loop-shaped electrodes 720 and the wireless IC 220 to molding using a resin.

Also with this method, the wireless IC module 620 can be formed using a simple method.

In addition, when subjected to molding using a resin in such a way that the common electrode 370 is exposed, since it is not likely that a floating capacitance will be generated between the wireless IC module 620 and the metal article even when the wireless IC module 620 is mounted on a metal article, the characteristics of the wireless IC module 620 can be prevented from changing.

Fifth Preferred Embodiment

FIGS. 15A and 15B illustrate a wireless IC module 630 according to a fifth preferred embodiment, where FIG. 15A is a plan view and FIG. 15B is a bottom surface view.

The wireless IC module 630 according to the fifth preferred embodiment, similarly to as in the third preferred embodiment, includes a wireless IC 230, a plurality of line-shaped electrodes 830 and common electrodes 470. However, in contrast to the third preferred embodiment, in the wireless IC module 630, the two-end coupling portions, which are not illustrated in FIGS. 15A and 15B, the plurality of line-shaped electrodes 830 and the common electrodes 470 are not conductively connected with each other. That is, the wireless IC module 630 has two common electrodes 470 and loop-shaped electrodes 730 are formed by these common electrodes 470 being capacitively coupled with each other. As illustrated in FIG. 15B, the two common electrodes 470 overlap each other with an insulating layer therebetween on the back surface of a board 330 and are capacitively coupled.

Thus, even though the two-end coupling portions, the plurality of line-shaped electrodes 830 and the common electrodes 470 are not conductively connected with each other, the loop-shaped electrodes 730 can be formed.

A method of manufacturing the wireless IC module 630 according to the fifth preferred embodiment will now be described with reference to FIG. 16.

First, as illustrated in FIG. 16, the board 330 and a vapor-deposited PET film 333, on which a metal thin film is patterned, are prepared.

Once a metal plate 731, which is the metal thin film on the PET film 333, has been formed into the two-end coupling portions 430 and 530, the plurality of line-shaped electrodes 830 and the two common electrodes 470, the loop-shaped electrodes are formed. It is preferable that an adhesive be coated on the surface (back surface) opposite the surface on which the metal thin film has been formed on the PET film. In addition, to facilitate folding, folding portions 831 are formed in the plurality of line-shaped electrodes 830 at positions to be contacted with the edges of the board 330.

Next, the PET film 333 is placed on the board 330 such that the back surface of the PET film 333 faces downward. Then, the PET film 333 is folded so that the board 330 is enclosed. Thus, the metal plate 731 is folded so as to form a loop and the loop-shaped electrodes 730 are thus formed. At this time, the two common electrodes 470 overlap each other with the PET film 333 therebetween on the back surface of the board 330 and are capacitively coupled. In addition, since an adhesive is coated on the back surface of the PET film 333, in addition to the PET film 333 being bonded to the board 330, the two common electrodes 470 can be bonded to each other. Finally, the wireless IC module 630 is completed by mounting the wireless IC 230 on the two-end coupling portions 430 and 530 and by mounting (bonding) the two-end coupling portions 430 and 530 and the terminals of the wireless IC 230.

Thus, the wireless IC module 630 can be manufactured very simply by forming the loop-shaped electrodes 730 through capacitive coupling. In other words, since the loop-shaped electrodes 730 are formed by capacitive coupling and the common electrodes 470 are simply made to partially overlap each other in the method of manufacturing the wireless IC module 630 according to this preferred embodiment, there is no need to perform accurate matching of positions when forming the loop-shaped electrodes 730. In addition, in the method of manufacturing the wireless IC module 630 according to this preferred embodiment, since the common electrodes 470 are simply made to partially overlap each other and the overlapping area can be suitably adjusted, even when the sizes or thicknesses of the boards 330 differ, the wireless IC modules can be manufactured using the same PET film 333.

Figure 17:
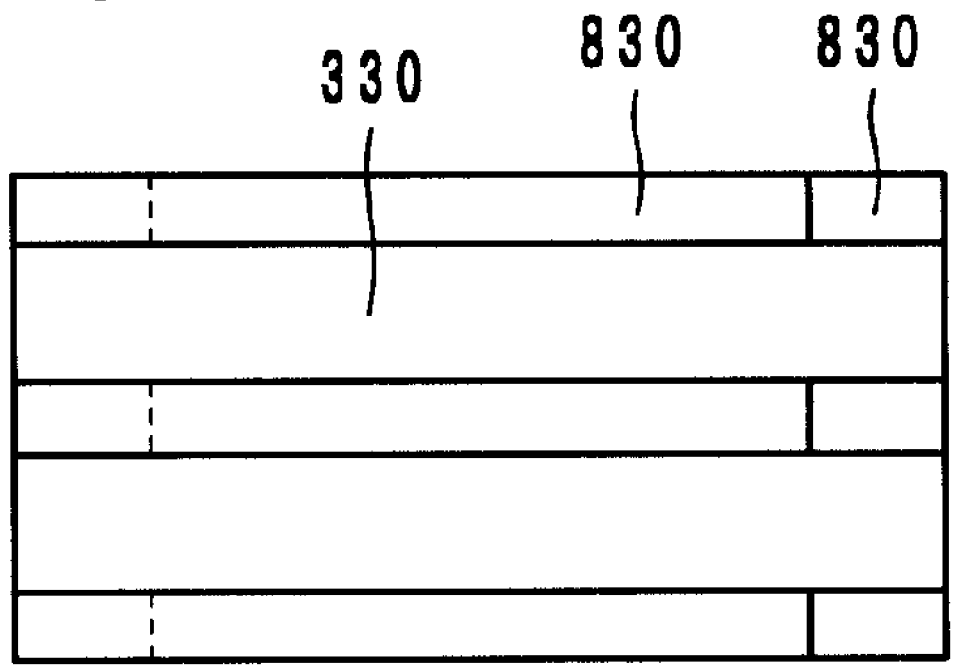
FIG. 17 illustrates a modified example of the wireless IC module according to the fifth preferred embodiment of the present invention.
Figure 18A:
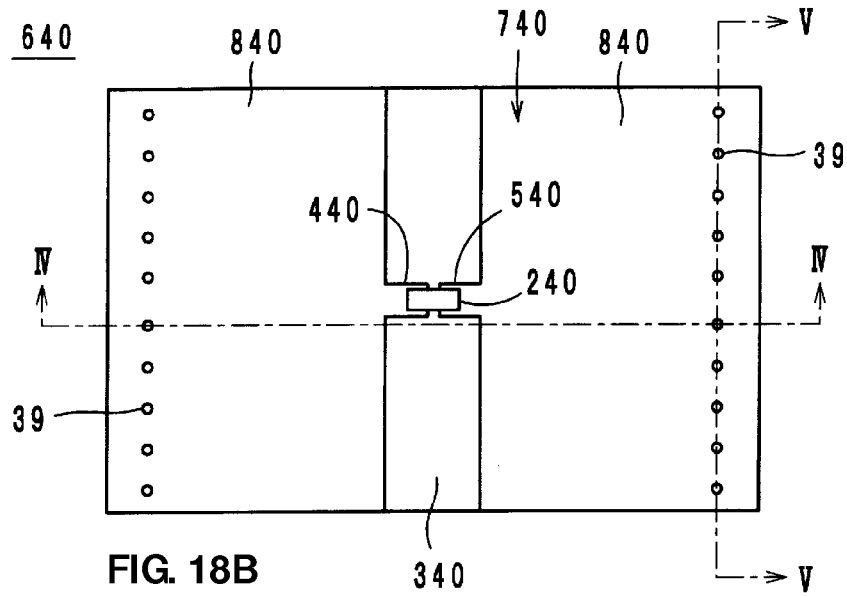
FIG. 18A-18D illustrate a wireless IC module according to a sixth preferred embodiment, where
Figure 18B:
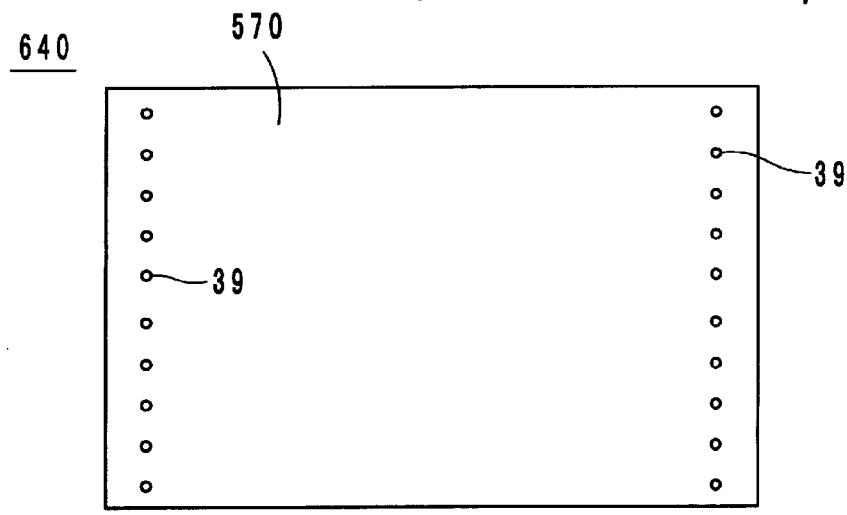
Figure 18C:
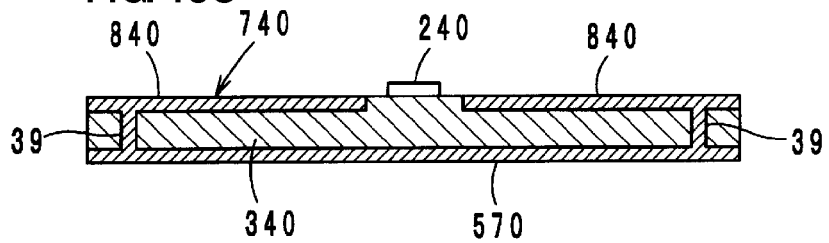
Figure 18D:
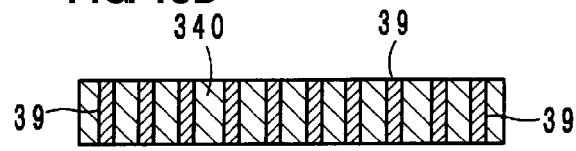

Furthermore, as illustrated in the bottom surface view of FIG. 17, the loop-shaped electrodes 730 include the two-end coupling portions, which are not illustrated, and the plurality of line-shaped electrodes 830, but the loop-shaped electrodes 730 may be formed by the line-shaped electrodes 830 being capacitively coupled with each other. In addition, the loop-shaped electrodes 730 may be formed by the common electrodes and the line-shaped electrodes being capacitively coupled with each other.

Sixth Preferred Embodiment

FIGS. 18A-18D illustrate a wireless IC module 640 according to a sixth preferred embodiment. The wireless IC module 640 includes a wireless IC 240 that processes predetermined radio signals and a loop-shaped electrode 740. The loop-shaped electrode 740 includes a pair of planar electrodes 840 provided on a top surface of a board 340, a common electrode 570 provided on a bottom surface of the board 340 and a plurality of via hole conductors 39 that electrically connect the electrodes 840 and 570. The wireless IC 240 is electromagnetically coupled (or may be directly connected) with the coupling portions 440 and 540 provided respectively in the pair of planar electrodes 840.

In the wireless IC module 640, the bottom surface, on which the common electrode 570 is located, serves as a mounting surface to be mounted onto an article and the state of mounting onto the article is the same as in the first preferred embodiment. The operating principle of the wireless IC module 640 is also the same as that described in the first preferred embodiment. In this preferred embodiment, instead of providing the via hole conductors 39, the electrodes 840 and 570 may be electrically connected to each other by forming a plurality of electrodes (perpendicular electrode portions) on side surfaces of the board 340.

Seventh Preferred Embodiment

Figure 19:
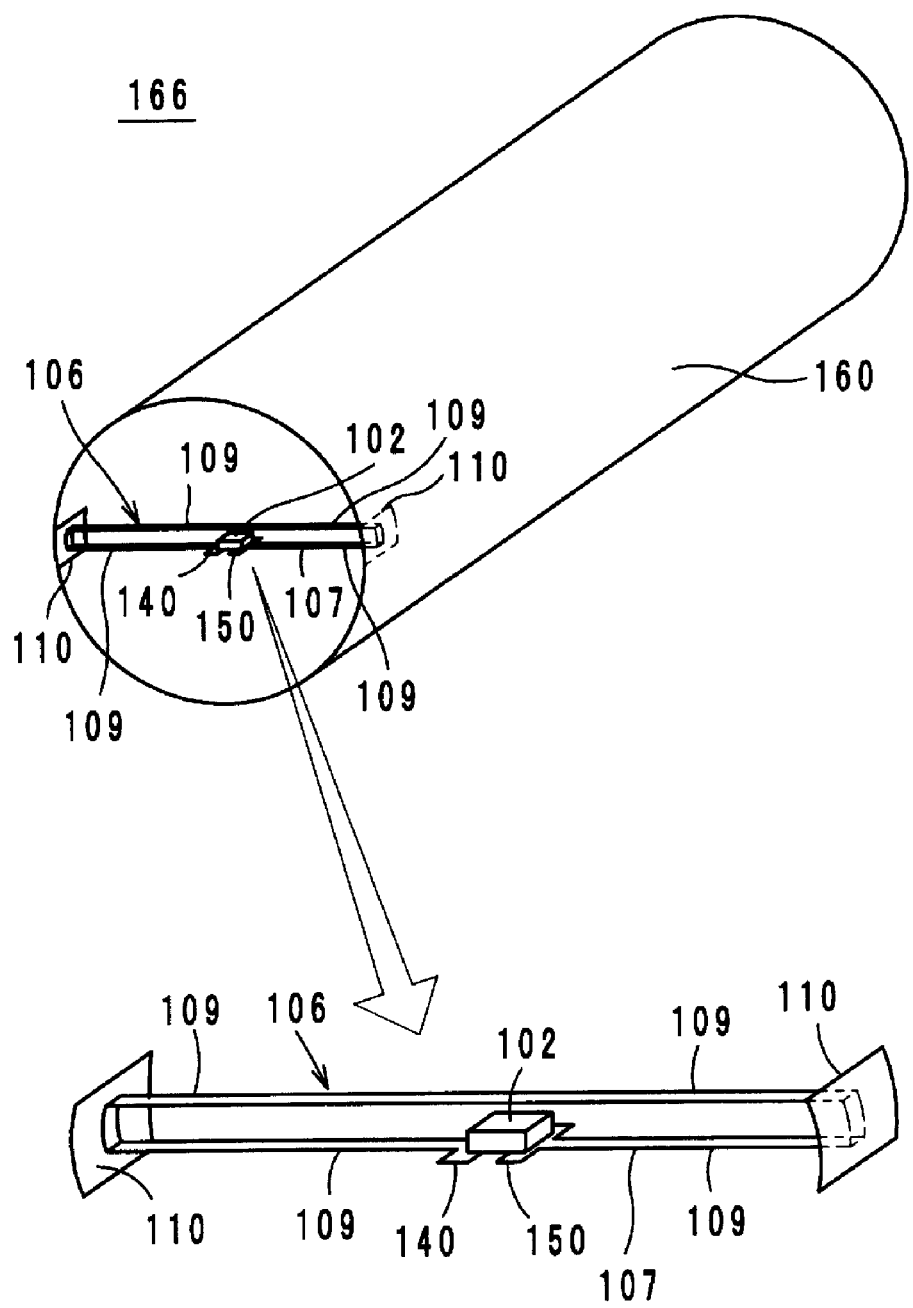
FIG. 19 illustrates a wireless IC device according to a seventh preferred embodiment.

FIG. 19 illustrates a wireless IC device 166 according to a seventh preferred embodiment.

In the wireless IC device 166 according to the seventh preferred embodiment, a wireless IC module 106 is mounted on a predetermined surface on the inside of a cylindrical metal article 160 and the wireless IC device 166 has a structure such that a loop-shaped electrode 107 of the wireless IC module 106 is electromagnetically coupled with a surface of the metal article 160.

In the wireless IC device 166 according to this preferred embodiment, in contrast to the first to sixth preferred embodiments, the metal article 160 is disposed so as to extend over positions that face the loop-shaped electrode 107 and the loop-shaped electrode 107 and the surface of the metal article 160 are coupled with each other. That is, in the first to sixth preferred embodiments, a plurality of loop-shaped electrodes are provided and the strength of the magnetic fields that couple with the radiation electrode is increased due to the increase in the number of perpendicular electrode portions with respect to the radiation electrode, whereas in this preferred embodiment the number of perpendicular electrode portions with respect to the radiation electrode is increased and the strength of the magnetic fields that couple with the radiation electrode is increased due to a plurality of places on the loop-shaped electrode 107 being made to serve as mounting surfaces. A feature shared by the first to sixth preferred embodiments is that there are a plurality of perpendicular electrode portions with respect to the radiation electrode, and it is preferable that there be four or more perpendicular electrode portions with respect to the radiation electrode, so that the strength of the magnetic fields coupled with the radiation electrode is large and therefore transmission and reception can be performed with high gain.

In this preferred embodiment, the loop-shaped electrode 107 preferably is a square-shaped loop and two planar electrode surfaces 110, which face each other and are positioned so as to be perpendicular or substantially perpendicular to a coupling surface having coupling portions 140 and 150 coupled with a wireless IC 102, are in contact with the inside of the cylindrical metal article 160. The two facing electrode surfaces 110 are bonded to the metal article 160 through a non-conductive adhesive or the like. Thus, the coupling surface that is coupled with the wireless IC 102 and the surfaces that are parallel thereto are perpendicular or substantially perpendicular to the surface of the metal article 160 and serve as perpendicular electrode portions 109.

In this preferred embodiment, the loop-shaped electrode 107 is disposed inside the cylindrical metal article 160, the metal article 160 and the loop-shaped electrode 107 are bonded to each other at a plurality of positions, and as a result, there are preferably four perpendicular electrode portions 109 with respect to the metal article 160. That is, there are two bonding portions (included in the electrode surfaces 110) between the metal article 160 and the loop-shaped electrode 107, there are two perpendicular electrode portions 109 that are perpendicular or substantially perpendicular to a first bonding portion and two perpendicular electrode portions 109 that are perpendicular or substantially perpendicular to a second bonding portion and therefore there are four perpendicular electrode portions 109 with respect to the metal article 160. Since there are a large number of the perpendicular electrode portions 109 with respect to the metal article 160, the strength of the magnetic fields coupled with the metal article 160 is high and transmission and reception can be performed with high gain. In addition, in this preferred embodiment, the perpendicular electrode portions 109 are preferably arranged so as to extend across the space inside the cylindrical metal article 160 and therefore efficient coupling with the magnetic field generated inside the cylindrical metal article 160 can be performed and transmission and reception can be performed with high gain.

Figure 20:
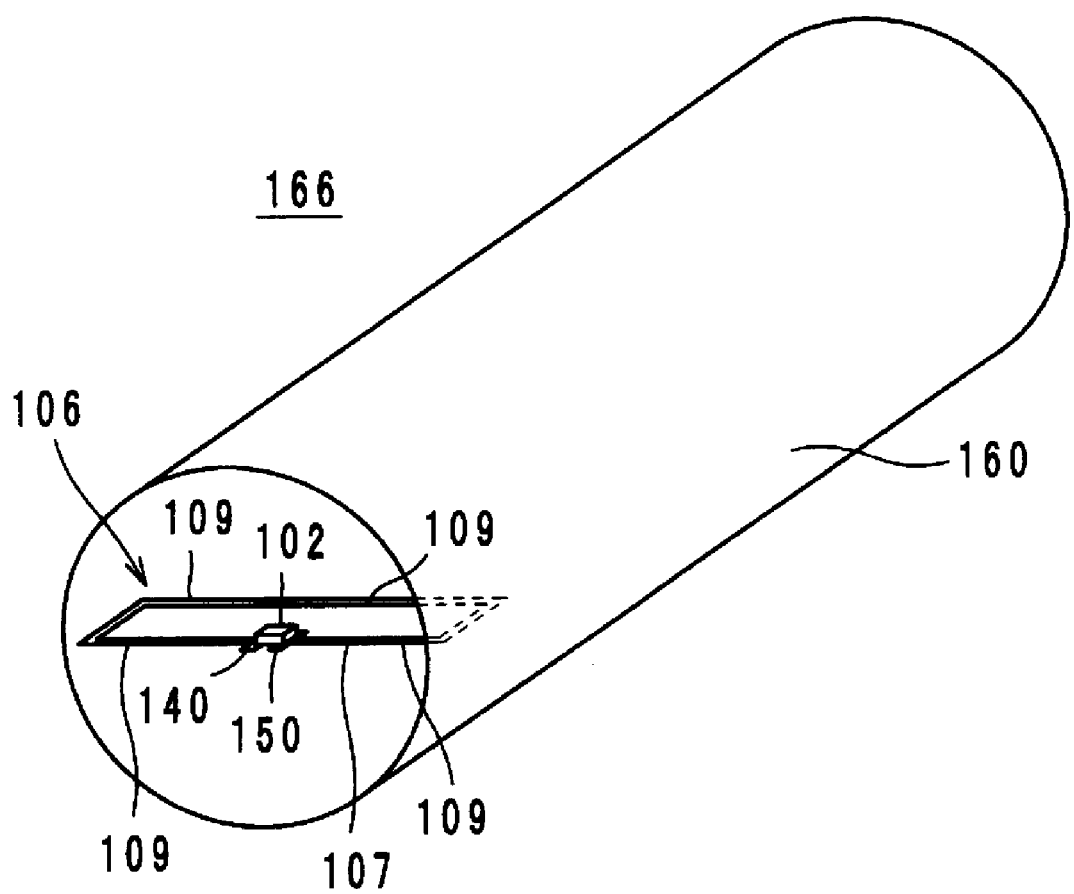
FIG. 20 illustrates a modified example of the wireless IC device according to the seventh preferred embodiment of the present invention.

In addition, as illustrated in FIG. 20, the loop-shaped electrode 107 and the metal article 160 may be coupled with each other through being conductively connected to each other.

In this preferred embodiment, the wireless IC module 106 is attached to the inside of the cylindrical metal article 160 and since the electromagnetic field generated inside the cylindrical metal article propagates to the outside, the field can couple with an external electromagnetic field.

Other Preferred Embodiments

Wireless IC devices, wireless IC modules and methods of manufacturing a wireless IC module are not limited to the above-described preferred embodiments and it goes without saying that they can be modified in various ways within the scope of the sprit of the invention.

For example, in the above-described preferred embodiments, an example was described in which a wireless IC module is preferably mounted on an article having a rectangular parallelepiped shape but the wireless IC module can be instead mounted on an article having another shape. If the wireless IC module is mounted on a cylindrical article, signals can be received from any direction and signals can be transmitted in any direction.

Furthermore, in the preferred embodiments, an example in which the wireless IC module is mounted on the outside of an article was described, but, as described in the seventh preferred embodiment, even when the wireless IC module is mounted inside an article, as long as a portion that allows an electromagnetic field to be communicated therethrough such as a hole or a gap is formed, it can still function as an element of an RFID system.

Furthermore, the plurality of loop-shaped electrodes may be formed of two-end coupling portions and a plurality of line-shaped electrodes, and they need not include a common electrode connected to the plurality of loop-shaped electrodes.

In addition, the impedances of the wireless IC and the radiation electrode may be matched through the loop-shaped electrodes.

Moreover, a ferrite may be included in the resin molded around the board on which the loop-shaped electrode is formed and the loop-shaped electrode. If a ferrite is included, the strength of the magnetic fields generated from the loop-shaped electrodes is large and transmission and reception can be performed with a high gain.

As has been described above, various preferred embodiments of the present invention may preferably be used in wireless IC devices and wireless IC modules and are particularly excellent in that a wireless IC device or module can function as an element of an RFID system even when affixed to an article containing metal, moisture, salt or the like without sacrificing reductions in size or thickness.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A wireless IC device comprising:
a wireless IC that processes radio signals;
a radiation electrode that defines a radiating member; and
a plurality of loop-shaped electrodes each including a plurality of perpendicular electrode portions that are perpendicular or substantially perpendicular to a plane of the radiation electrode, each of said plurality of loop-shaped electrodes having a loop shape defined by an electrode including the perpendicular electrode portions, and said plurality of loop-shaped electrodes being coupled with the wireless IC and the radiation electrode; wherein
the plurality of loop-shaped electrodes are connected in parallel with one another;
the wireless IC and the plurality of loop-shaped electrodes define a wireless IC module;
the plurality of loop-shaped electrodes includes a common electrode that is commonly connected to all others of the plurality of loop-shaped electrodes; and
the common electrode is located on a mounting surface of the wireless IC module.

2. The wireless IC device according to claim 1, wherein each of the plurality of loop-shaped electrodes includes at least four of the plurality of perpendicular electrode portions.

3. The wireless IC device according to claim 1, wherein the radiation electrode is disposed so as to extend across a position facing at least one of the plurality of loop-shaped electrodes.

4. The wireless IC device according to claim 1, wherein at least one of the plurality of loop-shaped electrodes is electrically conductive with the radiation electrode and a portion of the radiation electrode doubles as the at least one of the plurality of loop-shaped electrodes.

5. A wireless IC module comprising:
a wireless IC that processes predetermined radio signals; and
a plurality of loop-shaped electrodes that are coupled with the wireless IC; wherein
each of the plurality of loop-shaped electrodes includes a plurality of perpendicular electrode portions that are perpendicular or substantially perpendicular to a mounting surface of the wireless IC module;
the plurality of loop-shaped electrodes are connected in parallel with one another;
the plurality of loop-shaped electrodes includes a common electrode that is commonly connected to all others of the plurality of loop-shaped electrodes; and
the common electrode is located on the mounting surface of the wireless IC module.

6. The wireless IC module according to claim 5, wherein each of the plurality of loop-shaped electrodes includes at least four of the plurality of perpendicular electrode portions.

7. The wireless IC module according to claim 5, further comprising a board, wherein at least one of the plurality of loop-shaped electrodes is located on the board.

8. The wireless IC module according to claim 7, wherein the at least one of the plurality of loop-shaped electrodes includes a via hole conductor that extends through the board.

9. The wireless IC module according to claim 5, wherein at least one of the plurality of loop-shaped electrode is defined by capacitive coupling.

10. A method of manufacturing a wireless IC module including a wireless IC that processes predetermined radio signals and a plurality of loop-shaped electrodes that are coupled with the wireless IC, the method comprising:
- a step of preparing a metal plate that has been patterned to form a line-shaped electrode;
- a step of forming the plurality of loop-shaped electrodes each including a plurality of perpendicular electrode portions that are perpendicular or substantially perpendicular to a mounting surface of the wireless IC module by folding and wrapping the metal plate around a board; and
- a step of connecting the plurality of loop-shaped electrodes in parallel with one another; wherein the step of forming the plurality of loop-shaped electrodes includes forming a common electrode that is commonly connected to all others of the plurality of loop-shaped electrodes on the mounting surface of the wireless IC module.

11. A method of manufacturing a wireless IC module including a wireless IC that processes predetermined radio signals, and a plurality of loop-shaped electrodes that are coupled with the wireless IC, the method comprising:
- a step of preparing a metal plate that has been patterned to form a line-shaped electrode;
- a step of forming the plurality of loop-shaped electrodes each including a plurality of perpendicular electrode portions that are perpendicular or substantially perpendicular to a mounting surface of the wireless IC module by folding and wrapping the metal plate around a board;
- a step of connecting the plurality of loop-shaped electrodes in parallel with one another; and
- a step of subjecting the folded metal plate to molding using a resin; wherein the step of forming the plurality of loop-shaped electrodes includes forming a common electrode that is commonly connected to all others of the plurality of loop-shaped electrodes on the mounting surface of the wireless IC module.

* * * * *